(12) United States Patent
Faurie et al.

(10) Patent No.: US 10,497,833 B2
(45) Date of Patent: Dec. 3, 2019

(54) SEMICONDUCTOR MATERIAL INCLUDING DIFFERENT CRYSTALLINE ORIENTATION ZONES AND RELATED PRODUCTION PROCESS

(71) Applicant: SAINT-GOBAIN LUMILOG, Courbevoie (FR)

(72) Inventors: Jean-Pierre Faurie, Valbonne (FR); Bernard Beaumont, Le Tignet (FR)

(73) Assignee: SAINT-GOBAIN LUMILOG, Courbevoie (FR)

( * ) Notice: Subject to any disclaimer, the term of this patent is extended or adjusted under 35 U.S.C. 154(b) by 0 days.

(21) Appl. No.: 15/865,065

(22) Filed: Jan. 8, 2018

(65) Prior Publication Data

US 2018/0219129 A1 Aug. 2, 2018

Related U.S. Application Data

(63) Continuation of application No. 14/900,088, filed as application No. PCT/EP2014/062847 on Jun. 18, 2014, now Pat. No. 9,882,087.

(30) Foreign Application Priority Data

Jun. 18, 2013 (FR) ...................................... 13 55677

(51) Int. Cl.
*H01L 29/20* (2006.01)
*H01L 21/8252* (2006.01)
(Continued)

(52) U.S. Cl.
CPC .......... *H01L 33/32* (2013.01); *H01L 21/0242* (2013.01); *H01L 21/0243* (2013.01);
(Continued)

(58) Field of Classification Search
CPC ............. H01L 29/2003; H01L 29/2006; H01L 21/02389; H01L 21/0254; H01L 21/02458;
(Continued)

(56) References Cited

U.S. PATENT DOCUMENTS

| 9,224,904 B1 | 12/2015 | Kumar et al. |
| 2007/0072396 A1 | 3/2007 | Feltin et al. |
| 2013/0022773 A1* | 1/2013 | Aida ...................... C30B 25/18 428/64.1 |

FOREIGN PATENT DOCUMENTS

| EP | 1881522 A2 | 1/2008 |
| EP | 2559791 A1 | 2/2013 |

OTHER PUBLICATIONS

French Preliminary Search Report FR 1355677 dated Feb. 27, 2014, 2 pages.
(Continued)

*Primary Examiner* — Daniel Whalen
*Assistant Examiner* — Scott Stowe
(74) *Attorney, Agent, or Firm* — Abel Schillinger, LLP

(57) ABSTRACT

The invention relates to a manufacturing process of semiconductor material of element III nitride from a starting substrate, the process comprising:
the formation of an intermediate layer based on silicon on a starting substrate, said intermediate layer comprising at least two adjacent zones of different crystalline orientations, especially a monocrystalline zone and an amorphous or poly-crystalline zone,
growth via epitaxy of a layer of element III nitride on said intermediate layer,
the intermediate layer being intended to be vaporised spontaneously during the step consisting of growing the layer of element III nitride via epitaxy.

27 Claims, 9 Drawing Sheets

(51) Int. Cl.
*H01L 33/32* (2010.01)
*H01L 21/02* (2006.01)
*H01L 33/00* (2010.01)
*H01L 33/12* (2010.01)
*H01L 33/24* (2010.01)

(52) U.S. Cl.
CPC ...... *H01L 21/0254* (2013.01); *H01L 21/0259* (2013.01); *H01L 21/02458* (2013.01); *H01L 21/02502* (2013.01); *H01L 21/02513* (2013.01); *H01L 21/02658* (2013.01); *H01L 33/007* (2013.01); *H01L 33/0075* (2013.01); *H01L 33/0079* (2013.01); *H01L 33/12* (2013.01); *H01L 33/24* (2013.01)

(58) Field of Classification Search
CPC ............... H01L 33/0062; H01L 33/007; H01L 33/0075
See application file for complete search history.

(56) References Cited

OTHER PUBLICATIONS

Kim B et al: "Epitaxial Lateral Overgrowth of GaN on Si (111) Substrates using High-Dose N+ Ion Implantation", Chemical Vapor Deposition vol. 16, No. 1-3, pp. 80-84, XP 002678344, 2010.
International Search Report for PCT/EP2014/062847, dated Nov. 12, 2014, 3 pages.

* cited by examiner

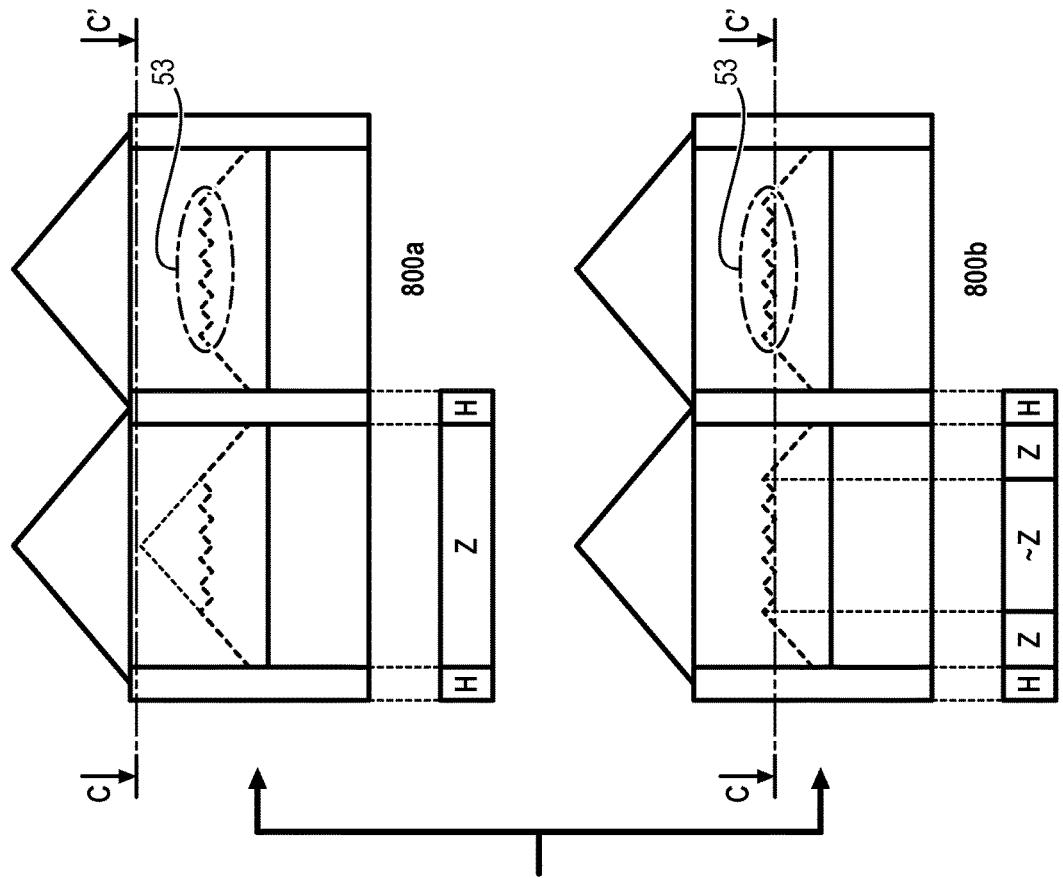
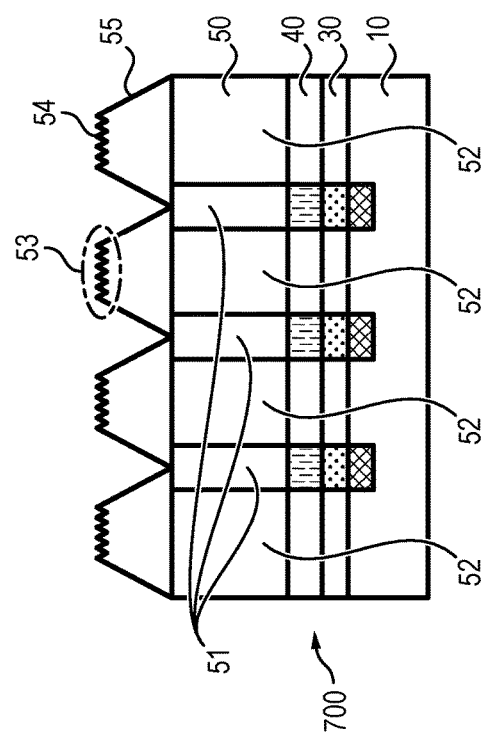
FIG. 1b

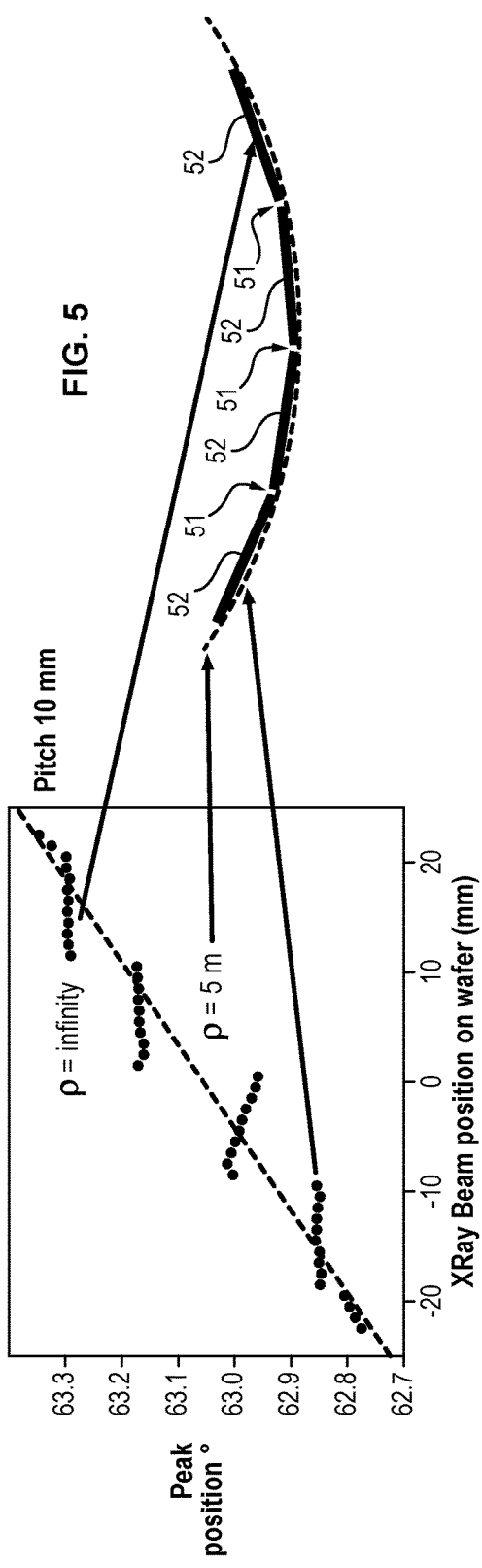
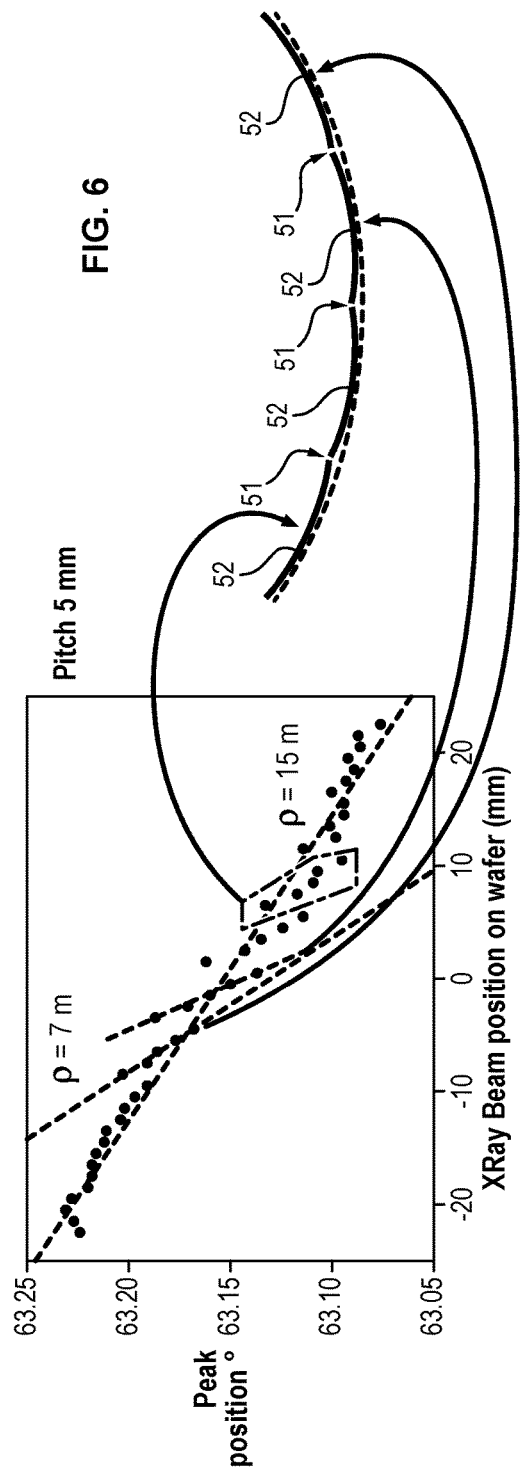

SEMICONDUCTOR MATERIAL INCLUDING DIFFERENT CRYSTALLINE ORIENTATION ZONES AND RELATED PRODUCTION PROCESS

CROSS-REFERENCE TO RELATED APPLICATION(S)

The present application is a continuation of and claims priority to U.S. patent application Ser. No. 14/900,088, filed Dec. 18, 2015, entitled "SEMICONDUCTOR MATERIAL INCLUDING DIFFERENT CRYSTALLINE ORIENTATION ZONES AND RELATED PRODUCTION PROCESS," by Faurie et al., which is a US national stage entry under 35 U.S.C. § 371 of International Application No. PCT/EP2014/062847, filed Jun. 18, 2014, entitled "SEMICONDUCTOR MATERIAL INCLUDING DIFFERENT CRYSTALLINE ORIENTATION ZONES AND RELATED PRODUCTION PROCESS," by Faurie et al., which claims priority under 35 U.S.C. § 119(b) to French Patent Application No. 1355677, filed Jun. 18, 2013, entitled "SEMICONDUCTOR MATERIAL INCLUDING DIFFERENT CRYSTALLINE ORIENTATION ZONES AND RELATED PRODUCTION PROCESS," by Faurie et al., all of which applications are incorporated by reference in their entireties.

TECHNICAL FIELD

The invention relates to semiconductor material, for example autosupported, based on elements of columns III and V of the periodic table, and its associated manufacturing process. Such material can be intended for making semiconductor structures such as light-emitting diodes (LED) or laser diodes (LD).

PRESENTATION OF PRIOR ART

Semiconductor materials based on nitrides of elements III of the periodic table—such as materials based on gallium nitride GaN—occupy an increasingly more important place in the fields of electronics and optoelectronics, especially for making semiconductor components such as light-emitting diodes (LED) or laser diodes (LD).

Current manufacturing processes of semiconductor materials based on element III nitride are based on the so-called hetero-epitaxia technique which comprises growing a crystal—such as a crystal of gallium nitride GaN—on a starting substrate of a different substance—such as a sapphire substrate.

However, the hetero-epitaxy technique causes numerous crystalline defects in the structure of element III nitride, such as dislocations. These crystalline defects limit performance and the service life of components based on element III nitride.

These defects originate especially from the difference in structure between the starting substrate (on which the growth of element III nitride is carried out) and the layer of element III nitride from which the semiconductor component is made.

For example in the case of the manufacture of a layer of gallium nitride, the starting substrate generally used for growth is sapphire whereof the crystalline network parameters (i.e. lattice parameter) and the thermal expansion parameters are very different to those of gallium nitride GaN.

Improvement today in manufacturing techniques allows the manufacture of layers based on element III nitride having a limited number of crystalline defects (dislocation density TDD<$5 \cdot 10^8$ cm$^{-2}$, where «TDD» is the acronym for the English expression «Threading Dislocation Density»).

Document EP 1 699 951 describes especially a manufacturing process of free-standing material of element III nitride comprising a deposit step of an intermediate layer based on silicon on a starting substrate, the intermediate layer based on silicon being a sacrificial layer intended to be vaporised spontaneously during a later epitaxy step of the element III nitride.

The spontaneous vaporisation of the intermediate sacrificial layer during the epitaxy step of element III nitride reduces the density of crystalline defects (in particular dislocations) inside the layer of element III nitride.

However, a disadvantage of all known manufacturing techniques is that reduction in the quantity of defects in the layer of element III nitride is accompanied by an increase in the fragility of said layer of element III nitride which then tends to crack.

In fact, the defects presents in a layer of element III nitride exhibit the property of absorbing stresses acting inside this layer. The decrease in defects of a layer of element III nitride is therefore accompanied by an increase in stresses in this layer, this increase in stress causing it to crack.

An aim of the present invention is to propose semiconductor material based on element III nitride having a limited number of crystalline defects, and in which the intensity of stresses is limited and kept under a cracking threshold of said material. Another aim of the present invention is to propose a manufacturing process of such semiconductor material.

SUMMARY OF THE INVENTION

1. Process According to the Invention

To this effect, the invention proposes a process for manufacturing a semiconductor material of element III nitride from a starting substrate, the process comprising the steps consisting of:
  forming an intermediate layer based on silicon, hereinbelow designated as a or the intermediate layer, on a starting substrate, said intermediate layer comprising at least two adjacent zones of different crystalline orientations, especially a monocrystalline zone and an amorphous or poly-crystalline zone,
  growing a layer of element III nitride via epitaxy on said intermediate layer,
the intermediate layer designed to be vaporised spontaneously during the step consisting of growing the layer of element III via epitaxy.

1.1. Definitions

Within the scope of the present invention «adjacent zones» means at least two zones placed side by side and not stacked, that is, arranged at the same level according to a growth axis A-A' of the semiconductor material, said zones preferably being in contact with each other.

In addition, it will be understood hereinbelow that when layer A is mentioned as being «on» a layer B, the latter can be directly on the layer B, or can be located above the layer B and separate from said layer B by one or more inserted layers.

It will also be understood that when a layer A is mentioned as being «on» a layer B, the latter can cover the entire surface of the layer B, or a portion of said layer B.

Within the scope of the present invention «zones of different crystalline orientations» is understood as:
either two monocrystalline zones of different orientations,
or a monocrystalline zone and a poly-crystalline zone,
or a monocrystalline zone and an amorphous zone.

1.2. Technical Effect of the Invention

The formation of an intermediate layer based on silicon comprising two adjacent zones of different crystalline orientations forms a layer of element III nitride also having adjacent zones of different crystalline orientations, especially:
a monocrystalline zone of element III nitride above a monocrystalline zone of the intermediate layer, and
an amorphous or poly-crystalline zone of element III nitride above an amorphous or poly-crystalline zone of the intermediate layer.

The amorphous or poly-crystalline zone(s) of the layer of element III nitride absorb stresses in the layer of element III nitride, which tends to limit the risk of cracking of the latter.

Further, the intermediate layer is spontaneously vaporised during the step consisting of growing the layer of element III nitride via epitaxy so as to dissociate said layer of element III nitride from the substrate.

1.3. Prior Art Documents and Basic Concept of these Documents a. Documents JP 8064791, JP19950029434, EP 1 731 632, EP 1 304 749, EP 1 995 796 and EP 1 296 362 already disclose processes proposing formation of a layer of element III nitride including monocrystalline zones and amorphous adjacent zones.

However, in these documents, it is neither described nor suggested that the presence of amorphous or poly-crystalline zones in a layer of element III nitride absorbs the stresses of the layer of element III nitride.

On the contrary, these documents all teach that the formation of amorphous or poly-crystalline zones in the layer of element III nitride diminishes the number of crystalline defects by trapping dislocations in the amorphous or poly-crystalline zones of the layer of element III nitride.

In addition, these documents describe no step consisting of forming an intermediate layer based on silicon on a starting substrate, said intermediate layer comprising at least two adjacent zones of different crystalline orientations.

b. Document EP 1 699 951 discloses forming a monocrystalline layer based on silicon on a sapphire substrate, the monocrystalline layer based on silicon being a sacrificial layer intended to be vaporised during later deposit via epitaxy of a layer of element III nitride.

However, this document describes no step consisting of forming an intermediate layer based on silicon on a starting substrate, said intermediate layer comprising at least two adjacent zones of different crystalline orientations.

In addition, this document does not instruct the expert that a layer based on silicon including adjacent zones of different crystalline orientations vaporises during later deposit via epitaxy of a layer of element III nitride.

2. Optional Characteristics of the Invention

Preferred though non-limiting aspects of the process according to the invention are described hereinbelow.

2.1. First Optional Characteristic

The step consisting of forming the intermediate layer can comprise:
creation of at least one amorphous or poly-crystalline zone in the starting substrate, and
deposit of the intermediate layer on the starting substrate to form an intermediate layer based on silicon comprising at least one amorphous or poly-crystalline zone and at least one adjacent monocrystalline zone.

The amorphous or poly-crystalline zone(s) can be created:
either directly in the starting substrate,
or by deposit of a layer of amorphous or poly-crystalline element III nitride which is then etched to form a pattern comprising one (or more) amorphous or poly-crystalline zones.

Creating an amorphous or poly-crystalline zone or zones directly in the starting substrate limits the number of steps necessary for manufacturing the semiconductor material.

In fact, an advantage of the process according to the invention is that the starting substrate can be reused several times after separation of the layer of element III nitride to make several semiconductor materials.

When the monocrystalline and the amorphous or poly-crystalline zone or zones have been created in the starting substrate, depositing the intermediate layer on the starting substrate causes the formation of:
a monocrystalline zone or zones in the intermediate layer, above the monocrystalline zone or zones of the starting substrate, and
an amorphous or poly-crystalline zone or zones in the intermediate layer, above the amorphous or poly-crystalline zone or zones of the starting substrate.

In fact, the crystalline orientation of the starting substrate propagates in the intermediate layer.

More precisely, the crystalline orientation or the absence of crystalline orientation of the substrate propagates in the intermediate layer; for example:
the crystalline orientation of monocrystalline zones of the substrate propagates in the intermediate layer: the zones of the intermediate layer located above the monocrystalline zones of the substrate are monocrystalline,
the absence of crystalline orientation of amorphous zones propagates in the intermediate layer: the zones of the intermediate layer located above the amorphous zones of the substrate are amorphous or in a poly-crystalline state close to the amorphous state.

2.2. Second Optional Characteristic

Advantageously, creating at least one amorphous or poly-crystalline zone in the starting substrate can comprise a sub-step consisting of:
bombarding at least one zone of the starting substrate by plasma to create said and at least one amorphous or poly-crystalline zone in the starting substrate.

Creating one (or several) amorphous zones in the starting substrate can be obtained:
either by implantation,
or by plasma bombardment.

The operation consisting of creating the amorphous or poly-crystalline zone(s) by using plasma bombardment (of argon or oxygen) has the advantage of being less expensive than an operation which creates one (or more) amorphous or poly-crystalline zones by implantation.

It also has the advantage of being easier to implement than an operation which creates one (or more) amorphous or poly-crystalline zones by implantation.

In fact, in the case of implantation of ions, the implantation parameters must be perfectly controlled to guarantee that the implantation of ions in the starting substrate is not too deep, and that degradation of the starting substrate en surface is sufficient.

2.3. Third Optional Characteristic

In a variant embodiment of the process, the creation of at least one amorphous or poly-crystalline zone comprises the sub-steps consisting of:
- depositing a protective mask on the starting substrate,
- bombarding the starting substrate covered by the protective mask by plasma, and
- removing the protective mask.

As indicated hereinabove, creating one (or more) amorphous zones in the starting substrate can be achieved either by implantation or by plasma bombardment.

In the case of an implantation operation, it is necessary to use a protective mask of metal type.

In the case of a plasma bombardment operation, it is possible to use a protective mask of dielectric or resin type.

The fact of using a protective mask to create amorphous zones:
- lowers the cost of the process by curtailing the number of steps necessary for creating the amorphous zone or zones,
- makes it easy to conduct the removal step of the mask once the amorphous zone or zones is created, and
- ensuring that the starting substrate is not «polluted» by the mask, contrary to the use of a metal mask whereof the use can cause contamination of the starting substrate by the metal of the mask, this metal being capable of reacting/diffusing locally in the starting substrate.

2.4. Fourth Optional Characteristic

As a variant to the optional characteristic mentioned in point 2.1, the formation step of the intermediate layer can comprise:
- deposit of an initial layer of amorphous or poly-crystalline element III nitride including at least one opening, and
- deposit of the intermediate layer on the initial layer to form an intermediate layer based on silicon comprising at least one amorphous or poly-crystalline zone and at least one adjacent monocrystalline zone.

The zone or zones of the starting substrate extending above of the opening (or openings) of the initial layer is (are) not covered by amorphous or poly-crystalline element III nitride.

Once the initial layer is deposited, the intermediate layer is deposited.

Depositing the intermediate layer on the starting substrate causes the formation of:
- a monocrystalline zone or zones in the intermediate layer, above the zone or zones of the starting substrate not covered by the initial layer of amorphous or poly-crystalline element III nitride, and
- an amorphous or poly-crystalline zone or zones in the intermediate layer, above the zone or zones of the starting substrate covered by the initial layer of amorphous or poly-crystalline element III nitride.

In fact, the crystalline orientations of the starting substrate and of the initial layer of element III nitride propagate in the intermediate layer.

More precisely, the crystalline orientation of the substrate and the absence of crystalline orientation of the initial layer of amorphous or poly-crystalline element III nitride propagates in the intermediate layer; for example:
- the crystalline orientation of monocrystalline zones of the substrate propagates in the intermediate layer: the zones of the intermediate layer located above the monocrystalline zones of the substrate are monocrystalline,
- the absence of crystalline orientation of zones of amorphous or poly-crystalline element III nitride propagates in the intermediate layer: the zones of the intermediate layer located above the amorphous zones or poly-crystalline of element III nitride are amorphous or in a poly-crystalline state close to the amorphous state.

2.5. Fifth Optional Characteristic

Depositing the initial layer can comprise the sub-steps consisting of:
- depositing an initial layer of amorphous or poly-crystalline element III nitride on the starting substrate,
- depositing a protective mask comprising at least one hole on the initial layer,
- etching the initial layer through said and at least one hole to obtain said and at least one opening of the initial layer, and
- removing the protective mask.

As a variant, depositing a mask including at least one hole on the starting substrate can be provided, then depositing the initial layer of amorphous or poly-crystalline element III nitride in the hole or holes of the mask, then removal of the mask.

2.6. Sixth Optional Characteristic

Preferably, the formation step further comprises a sub-step consisting of depositing on the intermediate layer a nucleation layer selected from AlN, $Al_xGa_yN$, $Al_xGa_yIn_zN$ (with x, y, z being positive natural whole numbers), InN, SiC, $Al_2O_3$, AlAs, GaAs or a combination of these different layers, said nucleation layer being deposited prior to the step consisting of growing the layer of element III via epitaxy.

The nucleation layer:
- plays the role of protective layer for the intermediate layer (the usual growth conditions of nitrides risk being corrosives for this intermediate layer; especially when the intermediate layer is silicon),
- serves as germination site for an element III nitride (monocrystalline above the monocrystalline zones of the intermediate layer, and amorphous or poly-crystalline above the amorphous or poly-crystalline zones of the intermediate layer), the lattice parameter of the nucleation layer being compatible with the later deposit of the layer of element III nitride; in other words the lattice parameter of the nucleation layer is close to that of the element III nitride so as to favour later deposit of the layer of element III nitride and minimise the formation of dislocations.

2.7. Seventh Optional Characteristic

In some embodiments, the step consisting of growing the layer of element III via epitaxy can be conducted at low temperature to favour a three-dimensional mode of epitaxial growth of the layer of element III nitride.

Favouring a three-dimensional mode of epitaxial growth produces a layer of element III nitride in which the monocrystalline zone or zones is (are) strongly doped in oxygen.

So, the resistivity of the monocrystalline zone or zones is diminished, and the result is a layer of element III nitride in which the conductivity of the monocrystalline zone or zones is uniform over the entire surface, which produces optoelectronic components over the entire surface of the monocrystalline zone or zones, with the exception of a few points where a plane C appears.

On the contrary, documents EP 1 731 632, EP 1 304 749, EP 1 995 796 and EP 1 296 362 propose favouring two-dimensional growth of the layer of element III nitride, which causes formation of poorly doped monocrystalline zones Y (and therefore having considerable resistivity) not utilisable for making optoelectronic components.

2.8. Eighth Optional Characteristic

In reference to the previous point 2.7, the step consisting of growing the layer of element III via epitaxy can for example be conducted as follows: the starting substrate provided with the intermediate layer is disposed on a substrate holder made of molybdenum, said substrate holder being put into a chamber for the growth of the layer of element III nitride, said chamber being set at a temperature between 900 and 1000° C., preferably between 950 and 1000° C. and even more preferably equal to 980° C.

2.9. Ninth Optional Characteristic

Advantageously, the step consisting of growing the layer of element III via epitaxy is maintained until a layer of element III nitride is obtained whereof the thickness is greater than or equal to twice the width of said and at least one monocrystalline zone.

This produces a layer of element III nitride in which the surface quality of the monocrystalline zone or zones is maximised.

2.10. Tenth Optional Characteristic

The process can also comprise a step consisting of cutting a wafer in the layer of element III nitride at a height greater than or equal to twice the width of said and at least one monocrystalline zone.

This limits the thickness of the resulting semiconductor material.

2.11. Eleventh Optional Characteristic

The process can also comprise the steps consisting of:
depositing a growth mask on the layer of element III nitride, the growth mask comprising:
    at least one pattern covering said and at least one amorphous or poly-crystalline zone of the layer of element III nitride, and
    at least one cavity extending above said and at least one monocrystalline zone,
conducting an operation of lateral epitaxial growth on the layer of element III nitride covered by the growth mask to form a second layer of element III nitride.

Conducting an operation of lateral epitaxial growth on the layer of element III nitride produces a second layer of element III nitride in which the amorphous or poly-crystalline zone(s) has (have) been left out, which increases the useable surface for making optoelectronic components.

From the resulting layer of element III nitride, it is possible to make a substrate of element III nitride characterised by the presence on a face of one or more crystalline zones adjacent to one or more amorphous or poly-crystalline zones and by the absence of amorphous or poly-crystalline zones on the other face.

The invention relates to such a substrate which can be made by conducting some steps of the process described previously, as well as any lateral epitaxial growth operation to be described in greater detail hereinbelow. In fact, in some embodiments—for example when at least one of the dimensions (in the growth plane) of the amorphous zone is minimal—it is not necessary to conduct a step of lateral epitaxial growth to cover the amorphous or poly-crystalline zones.

2.12. Twelfth Optional Characteristic

In the case of the use of a growth mask, the latter can comprise at least one pattern partially covering said and at least one monocrystalline zone of the layer of element III nitride.

This decreases the thickness of growth necessary to obtain a second layer of element III nitride plane.

Of course, the form and dimensions of the pattern or patterns covering the amorphous or poly-crystalline zone(s) can be different to the form and dimensions of the pattern or patterns partially covering the monocrystalline zone or zones.

2.13. Thirteenth Optional Characteristic

The process such as described in points 2.11 and 2.12 can comprise an operation of lateral epitaxial growth of long duration to form a very thick second layer of element III nitride, typically of the order of 10 mm or more, in which the amorphous or poly-crystalline zone(s) has (have) been left out. This allows cutting a plurality of wafers of element III nitride free of amorphous or polycrystalline zones. In fact, since all the stress resulting from the improvement in quality has been relaxed during the growth of the first layer of element III nitride because of the adjacency of crystalline zone(s) and amorphous or polycrystalline zones, it is possible to have the second layer of element III nitride grow to a considerable thickness and constant quality, without the presence of amorphous or polycrystalline zones.

From the plurality of wafers of element III nitride free of amorphous or poly-crystalline zones made in this way, it is possible to make a plurality of substrates of element III nitride free of amorphous or poly-crystalline zones.

2.14. Other Aspects

Other preferred though non-limiting aspects of the process described hereinabove are the following:
    the element III nitride is gallium nitride;
    the element III nitride is aluminium nitride;
    the intermediate layer based on silicon is silicon, or silicon comprising impurities selected from aluminium, gallium, phosphorous, boron or an alloy of silicon germanium;
    the intermediate layer based on silicon has a thickness between 100 nm and 10 μm;
    the layer of element III nitride has a thickness greater than 50 μm;
    the starting substrate is selected from sapphire, SiC, GaAs, AlN, and GaN or a combination of the latter.

3. Substrate According to the Invention

The invention also relates to a semiconductor substrate formed from a material based on element III nitride, said substrate comprising:

a monocrystalline region;

a plurality of stress relaxing regions extending into at least in part of the substrate and defining a plurality of interconnected bidimensional forms in the monocrystalline region; and wherein the substrate comprises at least one of the following:

a physical curve defining a radius of curvature of at least 5 m;

a variation of the offcut angle (2β) inferior or equal to about 0.6 degrees between a bidimensional form in a central part of the substrate having a offcut angle ($\propto_c$) et a bidimensional form in a peripheral part of the substrate arranged between the centre and a peripheral edge of the substrate having a offcut angle ($\propto_p$); and a relaxation ratio ($A_{sr}/A_{sc}$) less than or equal to about 30%, wherein $A_{sc}$ is the area of the plurality of interconnected bidimensional forms and $A_{sr}$ is the area of the plurality of stress relaxing regions.

Within the scope of the present invention, "offcut angle" means the angle formed between the growth surface of the substrate at a point of the surface and the crystalline planes at the same point.

According to an embodiment of the substrate, the geometrical variation between the plurality of interconnected bidimensional forms is less than or equal to 10% throughout the substrate.

Different definitions can be given to such a substrate.

This is why the invention also relates to a semiconductor substrate comprising a material based on nitride of group III, the substrate comprising:

a plurality of regions of stress relaxation;

a monocrystalline region extending between the plurality of regions of stress relaxation, the monocrystalline region forming a plurality of interconnected bidimensional forms;

in which the geometric variation between the plurality of bidimensional forms is less than or equal to 10% through the substrate.

The invention also relates to a semiconductor substrate formed from a material based on nitride of group III, the substrate comprising a monocrystalline region extending between a plurality of regions of stress relaxation, the monocrystalline region forming a plurality of interconnected bidimensional forms, in which each form of the plurality has a region of high resistivity having resistivity of around 1.0 ohm-cm or more on the substrate surface in the form, and in which each form of the plurality of forms is configured to contain at least one device structure formed on the substrate, said device structure having a device centre spaced apart from the region of high resistivity.

The invention also relates to a semiconductor substrate formed from a material based on nitride of group III, the substrate comprising a monocrystalline region extending between a plurality of regions of stress relaxation, the monocrystalline region forming a plurality of interconnected bidimensional forms, in which each form of the plurality of forms is configured to contain at least one device structure having a complementary form.

The invention also relates to a semiconductor substrate formed from a material based on nitride of group III, the substrate comprising:

a plurality of regions of stress relaxation;

a monocrystalline region extending between the plurality of regions of stress relaxation, the monocrystalline region forming a plurality of interconnected device regions having bidimensional forms;

a central zone located towards the centre of at least one device region to which a dopant has been added to lower the resistivity of the monocrystalline material in the zone.

Advantageously, the doped central zone can have resistivity which is substantially identical to the resistivity of the non-doped material towards the periphery of each zone. The dopant can comprise germanium. Finally, the resistivity of the doped central zone and the resistivity of the non-doped material towards the periphery of each zone can be between around 0.01 ohm-cm and 1.0 ohm-cm.

Preferred, though non-limiting, aspects of the substrate according to the different definitions of the latter given hereinabove are the following:

each bidimensional form has a Dmax/Dmin ratio of between 5 and 20, the directions defined by the largest dimension of the bidimensional forms are distributed uniformly between two perpendicular orientations defined on the surface of the substrate, the directions defined by the largest dimension of the bidimensional forms are distributed uniformly between three separate orientations of 120° defined on the surface of the substrate, the directions defined by the largest dimension of the bidimensional forms are distributed uniformly between the orientations defined on the surface of the substrate by the directions of the crystalline axes of the family of direction [10-10] or of the family of direction [11-20], the regions of stress relaxation comprise at least one of a poly-crystalline material or an amorphous material, the plurality of interconnected bidimensional forms is formed by a repetitive pattern of isolated regions of stress relaxation, each region of stress relaxation has the form of at least two connected lines extending in at least two non-parallel directions, the pattern of the regions of stress relaxation constitutes a plurality of interconnected polygonal, circular, ellipsoidal, irregular, hexagonal, equilaterally triangular or triangular forms, the pattern of the regions of stress relaxation constitutes a plurality of interconnected forms having an area of at least 14 cm², the pattern of the regions of stress relaxation constitutes a plurality of interconnected forms in which the largest dimension of the bidimensional form is at least 200 µm, the pattern of the regions of stress relaxation forms a plurality of interconnected forms in which the smallest dimension of the bidimensional form is at least 200 µm or more, the pattern of the regions of stress relaxation constitutes a plurality of interconnected forms in which the dimension of the bidimensional form in a first direction is greater than the dimension of the bidimensional form in a second direction, the regions of stress relaxation forming the repetitive pattern have a width of at least 10 µm, the regions of stress relaxation forming the repetitive pattern have a width of between 10 µm and 100 µm, each region of stress relaxation is in the form of at least two connected lines extending in at least two non-parallel directions, each region of stress relaxation is in the form of at least two connected lines, in which one line forms an angle with the other line, each region of stress relaxation is in a form in which a part of the form extends in a direction on the substrate surface, whereas another part of the form extends in a different direction on the substrate surface, the plurality of regions of stress relaxation acts to dissipate the stress through the substrate, the semiconductor substrate comprises gallium nitride, the semiconductor substrate has a thickness greater than 1 µm, preferably from 100 µm to 10 cm, more preferably from 500 µm to 3 mm, the plurality of interconnected bidimensional forms comprises at least one first form at a central region of the substrate and a second form at a peripheral region of the substrate, in which the geometric variation between the first form and the second form is less than or equal to 10%, the plurality of interconnected bidimensional forms comprises at least one first form at a central region of the substrate and a second form at a peripheral region of the substrate, in which the geometric variation between the first form and the second form is between 0.1% and 5%, or between 0.01% and 10%, the geometric variation comprises at least one of the following:
  variation of the size of the form,
  variation of the position of the form on the substrate,
  variation of the orientation of the form on the substrate,
  variation of at least one dimension of the form, or
  variation in total pitch between the regions of stress relaxation defining the plurality of forms, the interconnected bidimensional forms are connected by at least one zone of monocrystalline material having a width of at least 10 µm, the interconnected bidimensional forms are connected by at least one zone of monocrystalline material having a width of between 10 µm and 100 µm, the semiconductor substrate comprises a variation in offcut angle ($2\beta$) less than or equal to around 0.4 degree (+0.2 degree) between:
  a bidimensional form in a central part of the substrate having an offcut angle ($\alpha c$) and
  a bidimensional form in a peripheral part of the substrate arranged between the centre and a peripheral edge of the substrate having an offcut angle ($\alpha p$), the monocrystalline region is substantially devoid of cracks, substantially all the cracks in the substrate are localised in the regions of stress relaxation, the regions of stress relaxation extend vertically from the upper surface of the substrate towards the lower surface of the substrate, the monocrystalline region comprises a density of dislocations less than or equal to around $1\times10^7$ dislocations/cm2, the regions of stress relaxation comprise a density of dislocations greater than around $1\times10^8$ dislocations/cm2 or $1\times10^9$ dislocations/cm2, the substrate comprises a semiconductor wafer having a diameter greater than or equal to around ten centimetres and having a physical curvature defining a radius of curvature of at least around 12 m, the substrate comprises a physical curvature with a relative distance from a median reference plane less than or equal to ±50 the substrate comprises a relaxation ratio (Asr/Asc) less than or equal to around 20%, where:
  Asc is the area of the plurality of interconnected bidimensional forms and
  Asr is the area of the plurality of regions of stress relaxation, the substrate comprises a variation in offcut angle less than or equal to around 0.2 degree through the substrate, the substrate comprises a semiconductor wafer having a diameter equal to around five centimetres, and in which the semiconductor wafer comprises a crystalline curvature defining a radius of curvature of at least around 7 m, the substrate comprises a semiconductor wafer having a diameter equal to around 10 centimetres, and in which the semiconductor wafer comprises a crystalline curvature defining a radius of curvature of at least around 15 m, the substrate comprises a variation in total pitch between the plurality of interconnected bidimensional forms through the substrate less than or equal to 20%, through the substrate, the substrate comprises a variation in pitch less than or equal to 45 µm, The invention also relates to a production batch of substrates comprising at least twenty substrates, each of the substrates in the batch comprising a semiconductor substrate such as described hereinabove.

The invention also relates to the use of a semiconductor substrate such as described hereinabove for manufacturing optoelectronic components.

4. Material According to the Invention

The invention also relates to semiconductor material based on element III nitride, said material comprising at least two adjacent zones of different crystalline orientations, especially a monocrystalline zone and an amorphous or poly-crystalline zone, the crystalline orientation of the crystalline planes of said material being discontinuous along its surface.

Preferred though non-limiting aspects of the material according to the invention are the following:
  the material comprises a first face on which there are at least one monocrystalline zone and an adjacent amorphous or poly-crystalline zone, a second face which comprises no amorphous or poly-crystalline zone resulting from the presence of an amorphous zone or poly crystalline on the first face,
  the material comprises at least two monocrystalline zones of elongated form in a growth plane of the semiconductor material, each monocrystalline zone of elongated form having a larger dimension defined by a respective longitudinal direction, the longitudinal directions of the two zones being secant such that said monocrystalline zones of elongated form have different orientations in the growth plane,
  the material which comprises a face including a plurality of monocrystalline zones and at least one adjacent amorphous or poly-crystalline zone, the crystalline zones having a Dmax/Dmin ratio between 5 and 20,
  the directions defined by the largest dimension of the monocrystalline zones are distributed evenly between two perpendicular orientations defined on the face,
  the directions defined by the largest dimension of the monocrystalline zones are distributed evenly between three orientations separated by 120° defined on the face, the directions defined by the largest dimension of the monocrystalline zones are distributed evenly between the orientations defined on the face by the directions of the crystalline axes of the direction family [10-10] or of the direction family [11-20].

This semiconductor material can be obtained by carrying out the process described hereinabove.

The invention also relates to the use of semiconductor material such as described hereinabove for the manufacture of optoelectronic components.

BRIEF DESCRIPTION OF THE FIGURES

Other advantages and characteristics of the semiconductor material and its related manufacturing process will emerge from the following description of several variant embodiments, given by way of non-limiting examples from the attached diagrams, in which:

FIGS. 1a, 1b, and 2 illustrate two variant embodiments of a manufacturing process of semiconductor material of element III nitride from a starting substrate, FIGS. 5 and 6 illustrate deformations and variations of the orientation of the crystalline planes observed in substrates of GaN made according to the invention and flowing from implementing the invention; these substrates are characterised by discontinuity of the orientation of the crystalline planes systematically present in the passage of the amorphous or poly-crystalline zones.

FIGS. 7 and 8 further show concordance between the periodicity of the discontinuity of the orientation of the crystalline planes and the periodicity of the repetition of amorphous or polycrystalline zones in the intermediate layer based on silicon. The period is 10 mm for the substrate of element III nitride in FIG. 7, the period is 1.5 mm for that of FIG. 8. The geometry of the amorphous zones made in the intermediate layer based on silicon for making the measured substrates is illustrated in FIG. 9;

DETAILED DESCRIPTION

Figure 1A:
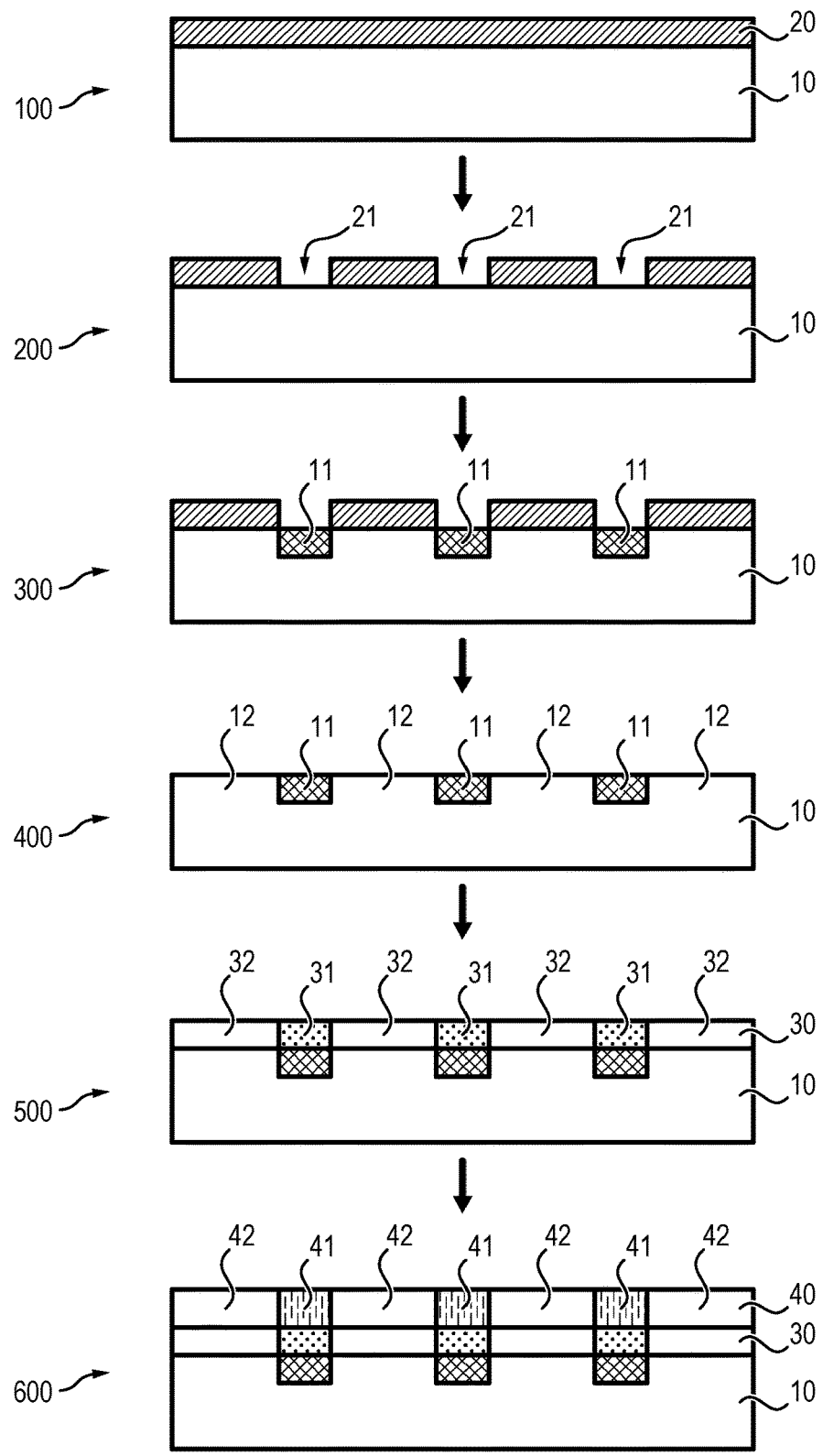

Different examples of manufacturing processes of semiconductor material, as well as products obtained in reference to the figures will now be described in more detail. In these different figures, equivalent elements bear the same reference numerals.

In reference to FIG. 1, this illustrates an embodiment of a manufacturing process of semiconductor material of element III nitride, and more precisely gallium nitride GaN on a starting sapphire substrate type. This process overall comprises three phases:

a first phase (steps 100 to 600) in which the starting substrate is treated to enable layer growth including adjacent zones of different crystallinity;

a second phase (step 700) in which a layer of gallium nitride GaN is epitaxied, a third phase (step 800a or step 800b) in which the layer of epitaxied gallium nitride is cut through its thickness to obtain a wafer of gallium nitride which can:

either be used for making semiconductor structures such as light-emitting diodes (LED), or as starting substrate for the growth of a new layer of element III nitride.

The process comprises a first step 100 consisting of depositing a layer of photosensitive resin 20 on the growth face (so-called «epitaxy-ready» face or «epi-ready» according to English terminology) of the sapphire substrate 10. As a variant, the layer of photosensitive resin could be replaced by a layer of material dielectric.

In another step 200 of the process, openings 21 are formed in the layer of photosensitive resin 20. The layer of photosensitive resin is illuminated by using a light emitting in the ultraviolet (UV) range. The layer of photosensitive resin 20 is exposed through an exposure mask (not shown) to light up only some regions of the photosensitive layer 20. Openings 21 form in the layer of photosensitive resin 20 at the level of the regions lit up by the UV light, such that some zones of the sapphire substrate 10 are no longer covered by the layer of photosensitive resin 20. This produces a protective mask comprising openings 21. Amorphous zones are then created in the sapphire substrate 10 at the level of the openings 21 of the protective mask.

In another step 300 of the process, the substrate is exposed to oxygen plasma $O_2$ or to argon plasma Ar. The sapphire substrate undergoes intense bombardment of ionised particles at the level of the openings 21 of the protective mask. This plasma bombardment destroys the crystalline character of the sapphire substrate 10 at the level of the zones of its growth face not covered by the protective mask. The crystalline zones of the substrate 10 located at the right of the openings 21 are converted into amorphous zones. The zones of the substrate covered by the protective mask are not damaged by the bombardment such that they retain their crystalline character. Exposure to plasma bombardment during a period of the order of 2 to 5 minutes is enough to destroy the crystalline character of the sapphire substrate 10 at its surface.

When the plasma bombardment step is complete, the protective mask is removed (step 400) from the substrate. This results in a sapphire substrate comprising adjacent zones of different crystallinity at the level of its growth face. The different crystallinity zones are mixed at the surface of the sapphire substrate.

Figure 3:
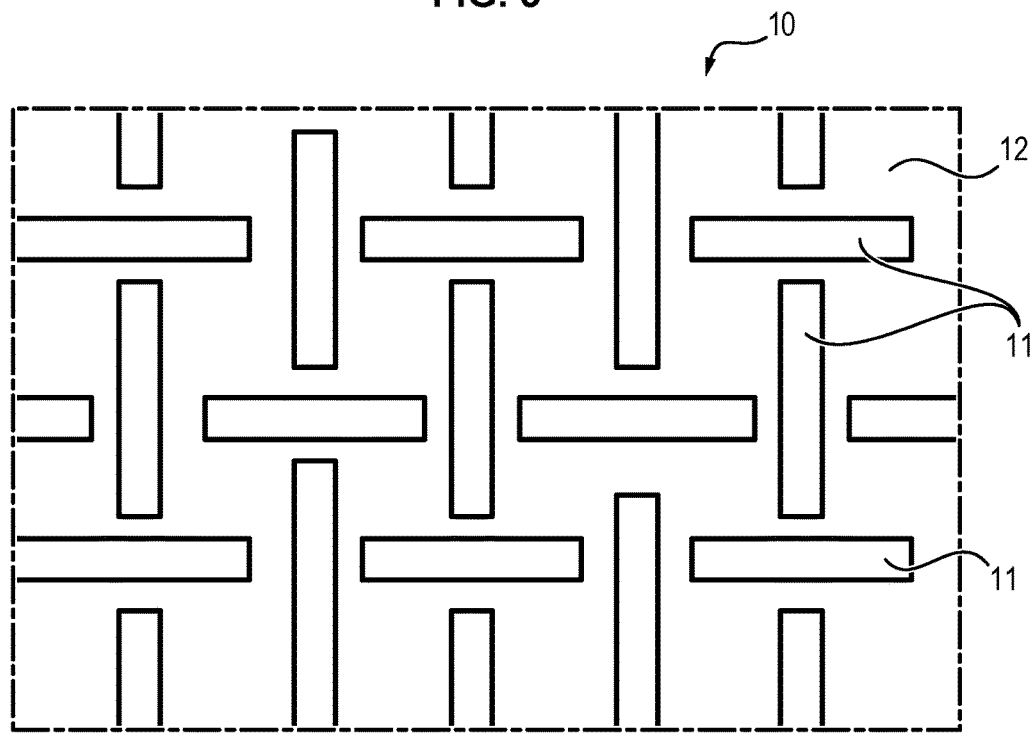
FIG. 3 illustrates in a plan view an example of a substrate of treated sapphire obtained by using a protective mask having a first pattern.

In reference to FIG. 3, this illustrates in a plan view an example of a treated sapphire substrate conducting steps 100 to 400 described previously. This sapphire substrate 10 comprises a plurality of monocrystalline zones 12 and adjacent amorphous zones 11 in its growth plane.

Of course, the forms of the monocrystalline zones and amorphous zones depend on the pattern of the protective mask. This pattern can have different shapes (pointed, square, triangular, strip, etc.) as a function of the specific application. In fact, a monocrystalline zone corresponds to a useful zone where the electronic component is or components are made. The surface of the crystalline zones 12 can be adjusted to that of a single electronic component or be larger to collect a multiplicity of these same components according to the application.

In particular, the protective mask can be selected such that the dimensions of a monocrystalline zone satisfy the conditions on a Dmax/Dmin ratio in which:

Dmax corresponds to the largest dimension of the monocrystalline zone in the growth plane, Dmax can be defined as being the length of the largest straight segment which is registered on the surface of the monocrystalline zone and whereof the ends are in contact with one (or more) amorphous or poly-crystalline zones adjacent to the relevant monocrystalline zone; this longest straight segment also defines a direction, without orientation constraint, which by definition will be the direction of the crystalline zone, and Dmin corresponds to the smallest dimension of the monocrystalline zone in the growth plane, Dmin can be defined as being the diameter of the largest circle totally registered in the monocrystalline zone, this circle being limited by contact with the adjacent amorphous or poly-crystalline zone or zones.

In the event of ambiguity reference will be made to the patterns of the protective mask for evaluations of Dmax and Dmin.

In particular, the geometric pattern of the protective mask can be selected such that this Dmax/Dmin ratio is:
strictly over 5, and
under or equal to 20.

The fact that the Dmax/Dmin ratio is strictly over 5 produces a layer of element III nitride including monocrystalline zones whereof the dimensions satisfy the needs of many applications. The fact that the Dmax/Dmin ratio is less than or equal to 20 maintains the stresses above a cracking threshold in the crystalline zone.

In fact, as explained previously, the amorphous or poly-crystalline zones are formed to limit the cracking phenomenon due to stresses in the layer of element III nitride.

To limit this cracking phenomenon, it is therefore preferable to limit the largest dimension Dmax of each monocrystalline zone to a value under a critical dimension or distance DC which is a function of a specific cracking threshold of the element III nitride material. This threshold can be determined experimentally by progressively increasing the largest dimension of the monocrystalline zones. Stresses can cause deformation of the crystalline zone when the dimension of the monocrystalline zone is less than the critical dimension then the appearance of cracks in the layer of element III nitride beyond this critical distance.

Preferably, the protective mask selected to form the monocrystalline zones and the amorphous or poly-crystalline zones has a single geometric pattern repeated many times on its surface. However, the mask can also comprise a single pattern intended to cover the entire surface of the substrate, such as for example a spiral pattern. Such a protective mask produces semiconductor material comprising two adjacent zones of different crystalline orientations, specifically:
a single monocrystalline zone and
a single poly-crystalline or amorphous zone.

These two zones have spiral forms such that the crystalline orientation of the crystalline planes of the monocrystalline zone is discontinuous along the surface of the semiconductor material.

A particular situation for stress is that where all the monocrystalline zones have a narrow elongated form, characterised by a large Dmax/Dmin ratio, however with Dmax<DC, and all have their largest dimension parallel to match the planned application, such as making components of laser or transistor type. Anisotropic deformation of the layer of element III nitride is noticed, and this is unfavourable for later transformation of the layer of element III into a substrate. Advantageously, orientation of the patterns can be varied on the surface of the protective mask. In particular, when the geometry of the pattern is elongated with a Dmax/Dmin ratio typically between 5 and 20, the protective mask can comprise a plurality of all the patterns, the orientation of the largest dimension varying (for example from 60° or 120°) between two adjacent sets of patterns.

This retains isotropy of deformation at the surface of the layer of element III nitride. More precisely, this prevents all stresses from propagating in a preferred direction, which would be the case if the patterns of elongated form were all aligned with the mask. So, isotropic distribution of the patterns on the mask retains deformation isotropy in the layer of element III nitride.

Another solution for maintaining stress isotropy can comprise using a protective mask in which the geometry of each pattern is itself isotropic. This is for example the case of a protective mask having a pattern as a square, rhombus, circle, or any pattern defining in the crystalline zone a larger Dmax dimension near the smaller dimension Dmin, typically Dmax/Dmin<3. More advantageously still, an isotropic pattern such as an equilateral triangle, a rhombus at 60°/120° or a hexagon will also have elements of crystalline symmetry of the element III nitride.

In reference again to FIG. 1, the process comprises a step 500 consisting of depositing a layer of silicon 30 onto the substrate 10.

The layer of silicon 30 acts intermediate layer intended to be vaporised spontaneously during the later step of growth via epitaxy of the layer of gallium nitride GaN.

Growth of the layer of silicon 30 on the substrate 10 including adjacent amorphous 11 and monocrystalline zones 12 causes formation of a layer of silicon 30 including adjacent amorphous zones 31 and crystalline zones 32.

In fact, the inventors have discovered that the crystallinity or the absence of crystallinity of the substrate propagates in the layer of silicon 30 deposited on the latter.

In this way, zones of amorphous silicon 31 or close to the amorphous state (i.e. poly-crystalline) form vertically to the amorphous zones 11 of the substrate 10, and the monocrystalline silicon zones 32 form vertically to the monocrystalline zones 12 of the substrate 10.

This results in a layer of silicon 30 including amorphous or poly-crystalline zones 31 and adjacent monocrystalline zones 32.

In another step 600 of the process, a layer of aluminium nitride AlN is deposited onto the layer of silicon 30. The layer of aluminium nitride AlN acts as buffer layer to improve the quality and crystalline morphology of the layer of gallium nitride GaN epitaxied later.

The epitaxy of the layer of aluminium nitride 40 on the layer of silicon 30 including adjacent amorphous zones 31 and monocrystalline zones 32 causes formation of a layer of aluminium nitride 40 including adjacent amorphous or poly-crystalline zones 41 and monocrystalline zones 42.

In fact, the inventors have discovered that the crystallinity or absence of crystallinity propagates in the layer of aluminium nitride 40.

Zones of amorphous aluminium nitride 41—or close to the amorphous state (i.e. poly-crystalline)—form above of the amorphous zones 31 of silicon, and the zones of monocrystalline aluminium nitride 42 form above of the monocrystalline zones 32 of silicon.

On completion of the deposit step of the layer of aluminium nitride, a stack is obtained comprising:
a sapphire substrate 10 including amorphous zones 11 and monocrystalline zones 12 at the level of its growth face,
a layer of silicon 30 on the substrate sapphire 10, the layer of silicon 30 including amorphous zones (or poly-crystalline) 31 and monocrystalline zones 32, a layer of aluminium nitride 40 on the layer of silicon 30, the layer of aluminium nitride 40 including amorphous zones (or poly-crystalline) 41 and monocrystalline zones 42.

The second phase of the process is then executed.

In a step 700 of the process, a layer of gallium nitride 50 is deposited onto the layer of aluminium nitride 40.

The layer of gallium nitride is deposited via epitaxy in vapour phase from chlorides and hydrides (or «HVPE», acronym of the English expression «Hydride Vapour Phase Epitaxy»). However, the expert will appreciate that depositing of the layer of gallium nitride can also be done via epitaxy in vapour phase with metal organics (or «MOVPE», acronym of the English expression «Metal Organic Vapour Phase Epitaxy»).

During growth of the layer of gallium nitride, the layer of silicon vaporises spontaneously such that the AlN/GaN stack comprising the layer of aluminium nitride AlN and the layer of gallium nitride GaN dissociates from the sapphire substrate.

This decoupling between the sapphire substrate and the AlN/GaN stack favourably limits the cracking phenomenon in the layer of gallium nitride by eliminating stresses tied to the differences in thermal coefficients between sapphire and gallium nitride during cooling subsequent to the deposit of the layer of gallium nitride 50. In the absence of amorphous or poly-crystalline zones 51, this decoupling unfavourably allows stresses, which continue growing with improvement in the crystalline quality of GaN, to be released by generating cracks during growth. The introduction of amorphous or poly-crystalline zones 51 provides places where stress can favourably relax without creating cracks. The introduction of zones 51 enables the manufacture of a layer of gallium nitride 50 without cracks comprising zones 52 of very high quality.

The growth of the layer of gallium nitride 50 on the layer of aluminium nitride 40 including mixed amorphous 41 and monocrystalline zones 42 causes formation of a layer of gallium nitride 50 including adjacent amorphous or poly-crystalline zones 51 and monocrystalline zones 52:

amorphous or poly-crystalline zones of gallium nitride 51 form above of the amorphous zones 41 of aluminium nitride, and monocrystalline zones of gallium nitride 52 form above of the monocrystalline zones 42 of aluminium nitride.

The layer of gallium nitride 50 does not grow equally to the surface of the layer of aluminium nitride because of the presence of amorphous or poly-crystalline zones 41 of aluminium nitride.

In fact, the growth rate of gallium nitride on a monocrystalline zone is greater by up to twice the growth rate of gallium nitride on an amorphous or poly-crystalline zone.

During growth of the layer of gallium nitride, this natural phenomenon causes formation of facets 55 which ensure continuity of the surface of the layer 50 between:

the amorphous or poly-crystalline zones 51 of gallium nitride above the zones 41 of aluminium nitride, and the upper growth region 53 above the monocrystalline zones of aluminium nitride 42.

Preferably, the growth temperature of the layer of gallium nitride is selected relatively low to induce a three-dimensional (3D) growth mode of the layer of gallium nitride 50. For example, the growth temperature of the layer of gallium nitride is kept substantially equal to 980° C.

This mode of 3D growth causes formation of islets and of facetted holes 54 at the level of the upper growth region 53. This allows strong doping in oxygen of gallium nitride because of the presence of facets, facets of islets and holes 54 and facets 55, over its entire growth surface. This strong doping in oxygen has the advantage of diminishing the resistivity of the layer of gallium nitride over its entire surface, which enables the manufacture of semiconductor structures over a larger surface of the layer of gallium nitride.

The growth of the layer of gallium nitride can be maintained until the upper region of growth 53 has completely disappeared. For example, the growth of the layer of gallium nitride can be maintained until a layer of gallium nitride of thickness greater than twice the width of a monocrystalline zone is obtained.

Of course, the growth of the layer of gallium nitride can also be interrupted before the upper region of growth 53 disappears completely.

On completion of the growth step of the layer of gallium nitride, the result is a stack comprising a layer of aluminium nitride and a layer of gallium nitride, the thickness of the layer of gallium nitride able to vary between 1 μm and 10 mm as a function of the specified application, the stack being autosupported and released from the starting substrate 10.

Another step 800a, 800b of the process consists of cutting the layer of gallium nitride through its thickness to obtain a wafer of gallium nitride. The wafer of gallium nitride can be cut in a region of the layer of gallium nitride where the upper growth region 53 has disappeared (step 800a), or in a region of the layer of gallium nitride where the upper growth region 53 is still present (step 800b). Steps 800a and 800b make, by polishing, substrates of plane GaN whereof the roughness Ra is of the order of an angstrom, without cracks with crystalline zones 52 of excellent quality specific to the growth of devices such as very high-power light-emitting diodes for lighting.

The resulting wafer of gallium nitride can be used to make optoelectronic components. In this case, the optoelectronic components are made on the monocrystalline zones of the wafer of gallium nitride.

As a variant, the wafer of gallium nitride can be used as a substrate for growing a new layer of element III nitride, especially gallium nitride.

Different growth techniques of the new layer of gallium nitride can be used, such as an epitaxial overgrowth technique (or «ELO», acronym of the English expression «Epitaxial Lateral Overgrowth»).

In the case of epitaxial lateral overgrowth, a growth mask is for example arranged on the wafer of gallium nitride and whereof the openings extend above the monocrystalline zones 52 of the wafer of gallium nitride, the mask covering the amorphous or poly-crystalline zones 51 of the wafer of gallium nitride.

Advantageously, the pattern of the mask can be provided to partially cover the monocrystalline zones of the wafer of gallium nitride. This limits the thickness of growth necessary to obtain a flat new layer of gallium nitride.

Figure 2:
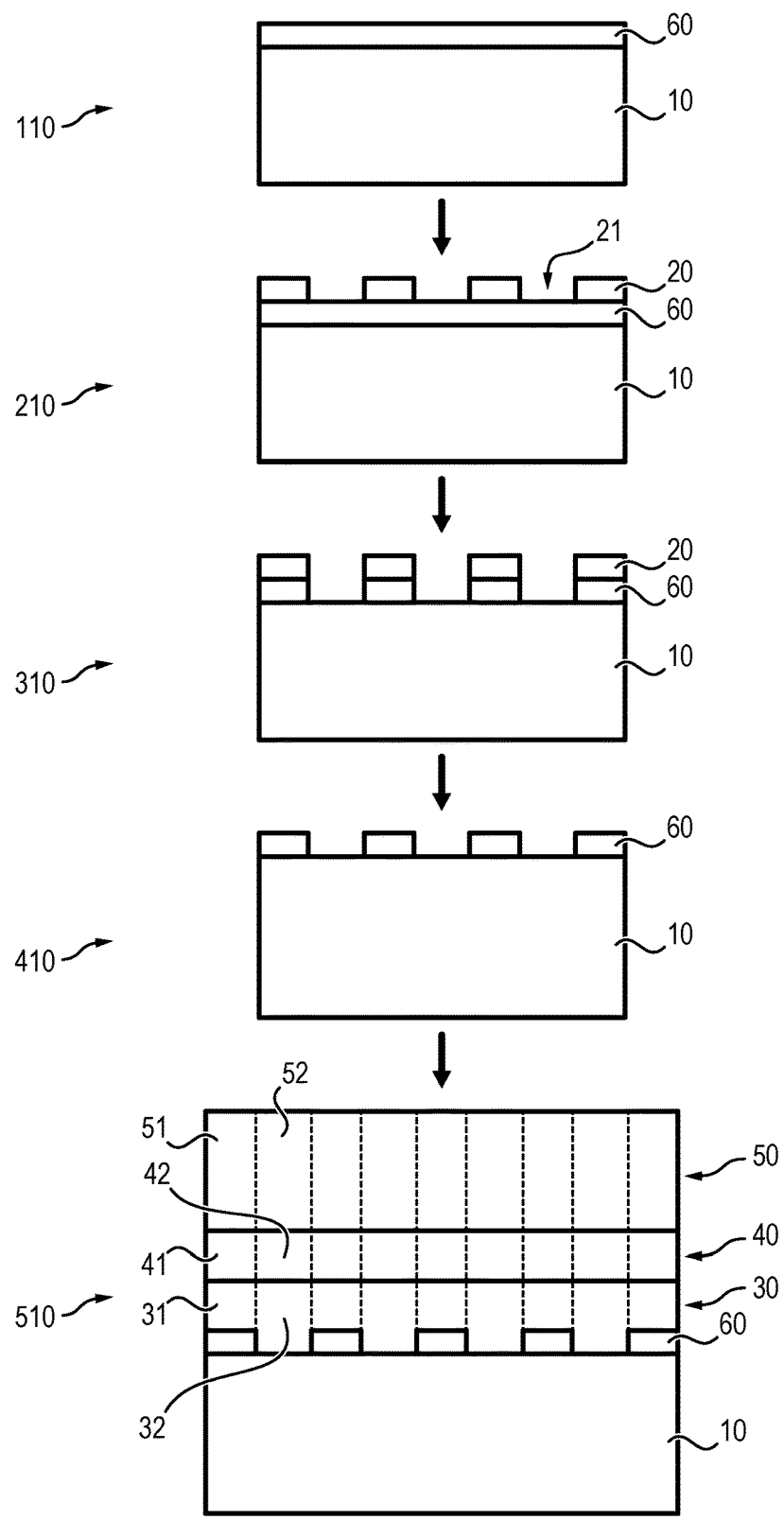

In reference to FIG. 2, this illustrates another embodiment of the manufacturing process of a layer of gallium nitride. This second embodiment differs from the process illustrated in FIG. 1 in that the crystalline quality of the sapphire substrate is not degraded to obtain amorphous zones.

A step 110 of this process comprises depositing a layer of amorphous gallium nitride 60 over the entire surface of the sapphire substrate 10. The layer of gallium nitride amorphous can be deposited by MOVPE at a very low temperature, typically less than or equal to 600° C. so as to favour amorphous growth of the gallium nitride.

As a variant, the deposit step of the layer of amorphous gallium nitride 60 can be replaced by a deposit step of a layer of amorphous aluminium nitride. The inventors have in fact noted that amorphous aluminium nitride, also obtained by deposit at very low temperature, can play the same role as the amorphous GaN in this embodiment.

In another step 210 of the process, a protective mask 20 including openings 21 is deposited on the layer of amorphous gallium nitride 60.

The layer of amorphous gallium nitride is then etched (step 310) through the openings 21 of the protective mask 20 until the sapphire substrate becomes visible.

In another step 410 of the process, the protective mask is removed, resulting in a sapphire substrate including zones of amorphous gallium nitride on its overgrowth face.

The growth of the layer based on silicon then occurs, as does the growth of the layer of aluminium nitride and the growth of the layer of gallium nitride (step 510), as described previously in reference to FIG. 1.

The crystalline orientation or the absence of crystalline orientation propagates through these different layers, resulting (prior to vaporisation of the layer based on silicon) in a stack comprising:
- a sapphire substrate 10,
- amorphous zones of gallium nitride 60 on the sapphire substrate 10,
- a layer based on silicon 30 on the sapphire substrate 10, said layer based on silicon 30 including:
  - amorphous or poly-crystalline zones 31 above amorphous zones of gallium nitride 60,
  - monocrystalline zones 32 above zones of the substrate not covered by the layer of amorphous gallium nitride 60,
- a layer of aluminium nitride 40 on the layer based on silicon 30, said layer of aluminium nitride 40 including:
  - amorphous or poly-crystalline zones 41 above amorphous or poly-crystalline zones based on silicon 31,
  - monocrystalline zones 42 above monocrystalline zones based on silicon 32,
- a layer of gallium nitride 50 on the layer of aluminium nitride 40, said layer of gallium nitride 50 including:
  - amorphous or poly-crystalline zones 51 above amorphous or poly-crystalline zones of aluminium nitride 41,
  - monocrystalline zones 52 above monocrystalline zones of aluminium nitride 42.

On completion of the growth step of the layer of gallium nitride including adjacent zones of different crystalline orientations, the steps of the second and third phases described in reference to FIG. 1 are conducted.

As described previously, different arrangements of the monocrystalline and amorphous (or poly-crystalline) zones can be obtained as a function of the protective mask selected.

Figure 4:
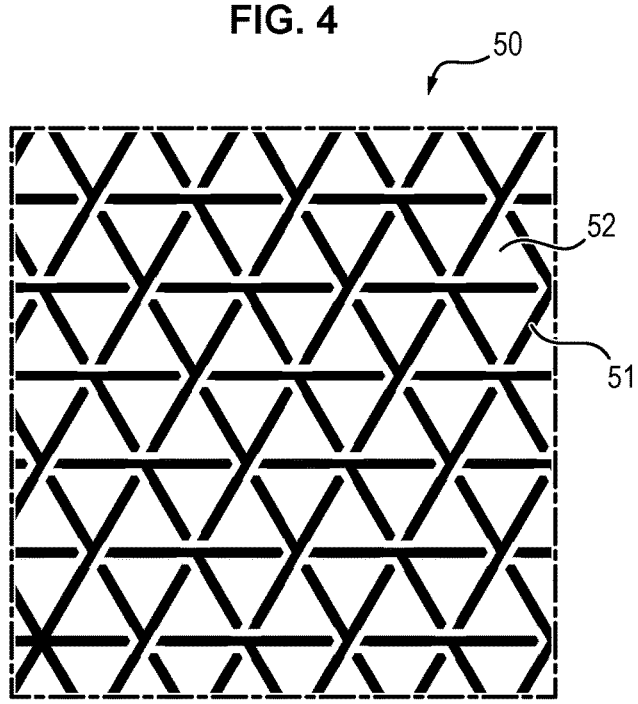
FIG. 4 illustrates in a plan view an example of a layer of gallium nitride obtained by using a protective mask having a second pattern.

In reference to FIG. 4, this illustrates an example of arrangements for monocrystalline and amorphous (or poly-crystalline) zones of a layer of gallium nitride 50 for a type of protective mask.

The monocrystalline zones 52 have an overall triangular form, and are enclosed by overall rectilinear amorphous or poly-crystalline zones 51 having different orientations.

In reference to FIGS. 5 and 6, these schematically illustrate the radii of curvature of two layers of gallium nitride 50 including alternating rectilinear monocrystalline zones and rectilinear amorphous (or poly-crystalline) zones. These two layers of gallium nitrides 50 were obtained by using the manufacturing process illustrated in FIG. 1.

These two layers of gallium nitride 50 differ in that the protective masks used in the manufacturing process have different pitches.

In the case of the layer of gallium nitride whereof the radius of curvature is illustrated in FIG. 5, the pitch of the protective mask used is 10 millimetres.

In the case of the layer of gallium nitride whereof the radius of curvature is illustrated in FIG. 6, the pitch of the protective mask used is 5 millimetres.

As is evident from these figures, the combination:
- of the formation of amorphous or poly-crystalline zones adjacent to monocrystalline zones, with
- use of a sacrificial layer based on silicon vaporising spontaneously during growth of the layer of gallium 50, produces discontinuity of the orientation of the crystalline planes in the layer of gallium nitride 50. This locally decreases stresses in the layer of gallium nitride 50 to below a critical threshold causing cracking of the latter.

In this way, the substrates of gallium nitride obtained by executing the process described hereinabove are characterised by discontinuity of the orientation of the crystalline planes systematically present for passage of amorphous or poly-crystalline zones, as shown in FIGS. 5 and 6.

It is evident in fact in FIGS. 5 and 6 that the substrates exhibit discontinuity of the orientation of the crystalline planes in the crystallised zones for passage of amorphous zones. This discontinuity is associated with the amorphous zones since it presents periodicity of said zones.

Figure 7:
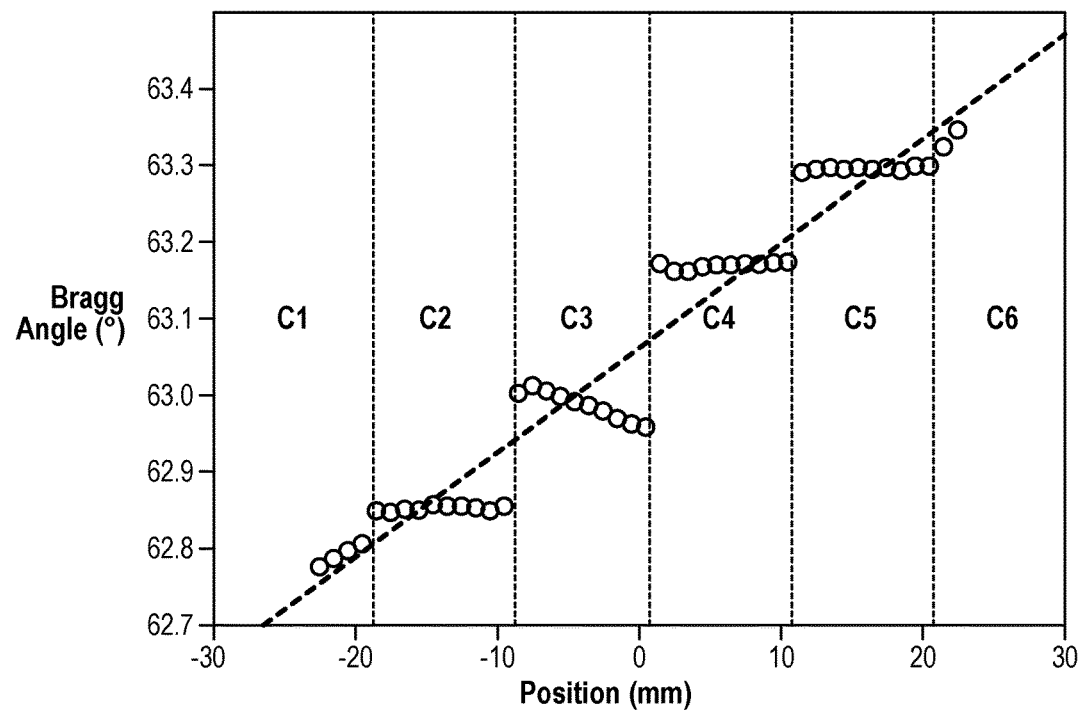
FIGS. 7 and 8 shows the orientation measurements of the crystalline planes in substrates according to the invention, taken by a standard X-ray diffraction method, which determine deformations and variations in orientation such as illustrated in FIGS. 5 and 6.
Figure 8:
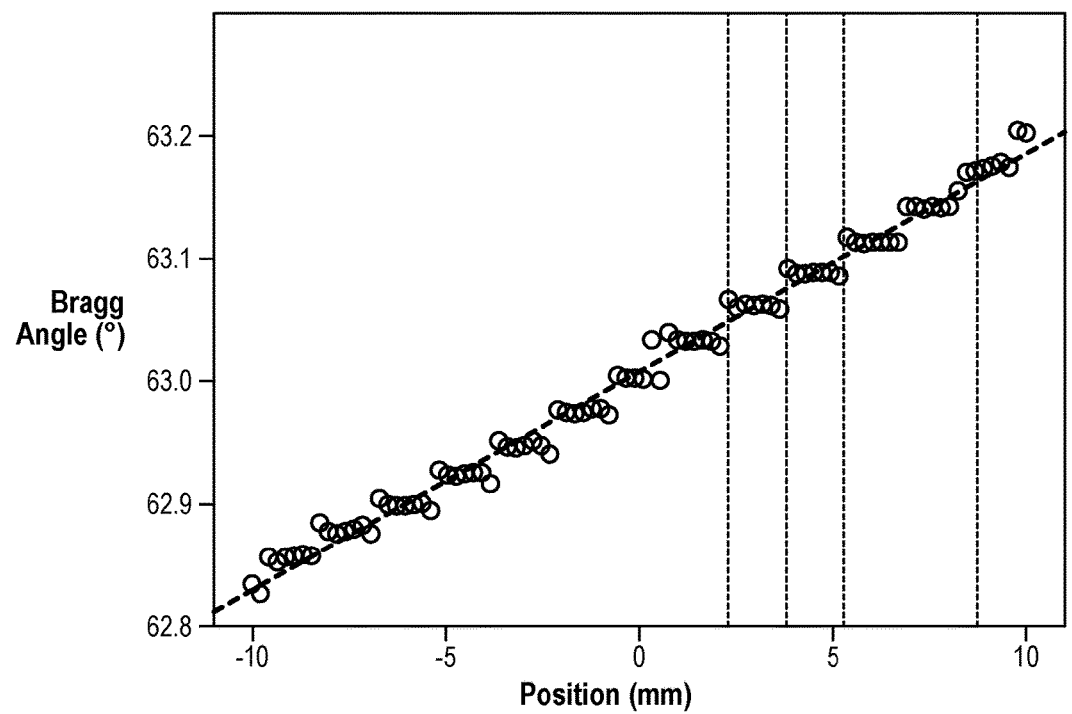

In reference to FIGS. 7 and 8, the orientation of the crystalline planes as a function of positions on the substrate along a measuring line 56 is illustrated. These crystalline orientation planes in substrates according to the invention, created by a standard X-ray diffraction method, determine the orientation deformations and variations such as illustrated in FIGS. 5 and 6.

FIGS. 7 and 8 further reveal the concordance between the periodicity of the discontinuity of the orientation of the crystalline planes and the periodicity of the repetition of the amorphous or poly-crystalline zones in the intermediate layer based on silicon. The period is 10 mm for the substrate of element III nitride of FIG. 7, and the period is 1.5 mm for that of FIG. 8.

Figure 9:
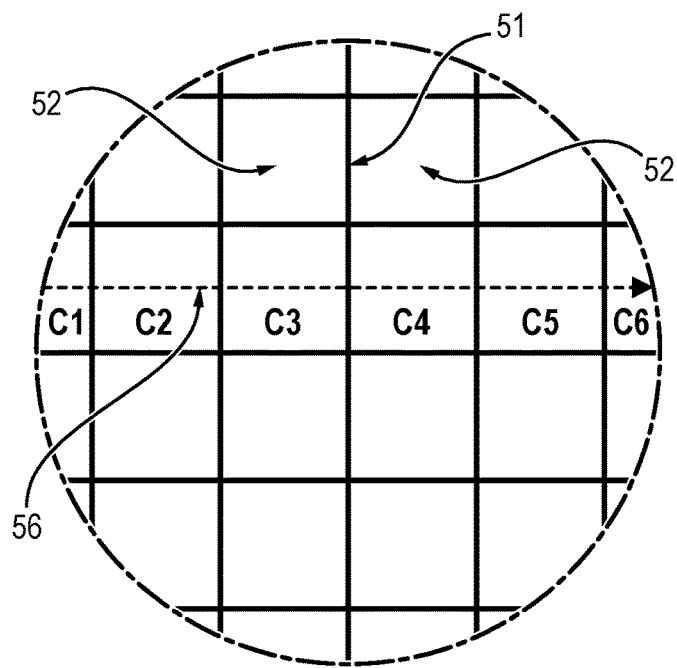

The geometry of the amorphous zones formed in the intermediate layer based on silicon for manufacturing the measured substrates is illustrated in FIG. 9.

Figure 10:
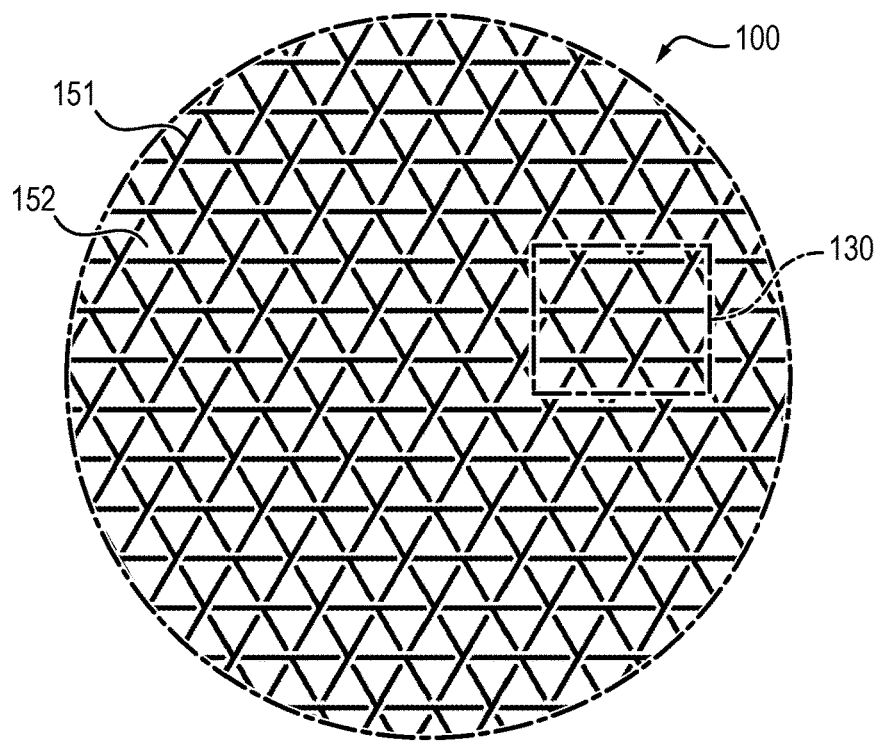
FIGS. 10 to 13 illustrate examples of semiconductor substrates according to the invention.

FIG. 10 illustrates a semiconductor substrate formed by using the process according to the invention described here. The semiconductor substrate 100 comprises a semiconductor wafer made of gallium nitride whereof an arrangement of the regions of stress relaxation 151 divides the monocrystalline region 152 into an interconnected plurality of triangular forms by using the pattern illustrated in FIG. 4. As described previously, different arrangements of the amorphous and/or poly-crystalline regions, which result in the monocrystalline region being divided into different interconnected formed regions, can be obtained as a function of the selected protective mask.

Generally, the semiconductor substrate 100 can be in the form of a semiconductor wafer having a form similar to a disc defining a particular diameter. For example, the diameter of the semiconductor wafer can be at least around 5.1 cm (around 2 inches), at least around 7.6 cm (around 3 inches), at least around 10 cm (around 4 inches), at least around 15 cm (around 6 inches), at least around 20 cm (around 8 inches) or even at least around 30 cm (around 12 inches).

In the embodiment of FIG. 10, a semiconductor substrate formed from a material based on nitride of group III comprises a region of monocrystal 152 (in other words, a monocrystalline region) and a plurality of regions of stress relaxation 151 extending in at least one part of the substrate and defining a plurality of interconnected bidimensional forms in the region of monocrystal. Preferably, the region of monocrystal is a continuous monocrystalline region divided into a plurality of interconnected regions. These interconnected regions are preferably identical as to size and form, but in practice there will be some inevitable degree of variation. As described in greater detail hereinbelow, the preferred embodiments reduce to a minimum any geometric variation through the substrate, improving predictability and productivity for devices formed on the substrate.

Figure 11:
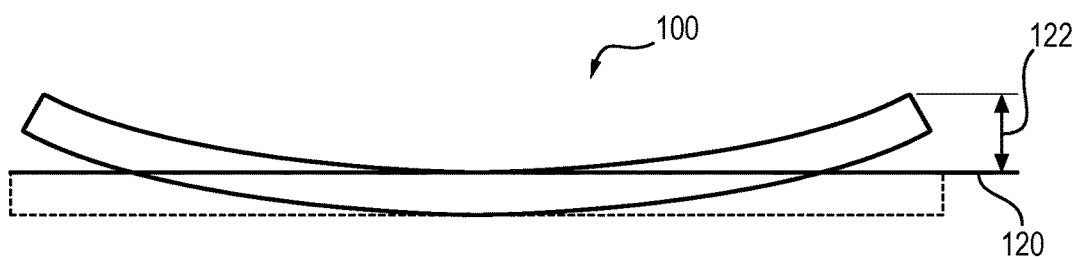

The regions of stress relaxation comprise amorphous and/or poly-crystalline regions as described hereinabove, which act to absorb stress/deformation of tension in the substrate. As illustrated in FIG. 11, the autosupported substrates or the semiconductor wafers 100 formed from material based on nitride of group III, such as GaN, generally have a curved concave form due to stress which appears during crystalline development. In FIG. 11, arrow 122 represents the quantity of physical curvature present relative to a median reference plane 120 (which would represent the surface plane of a semiconductor wafer without curvature). Also, the substrate can have a physical curvature such as illustrated, as well as a curvature of the internal crystalline structure.

Figure 12:
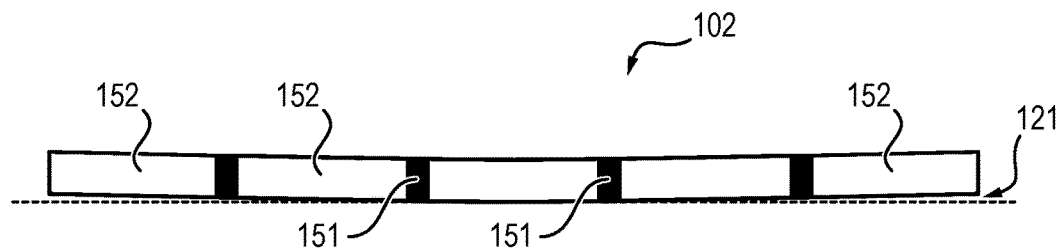

As illustrated in FIG. 12, however, in the embodiments of the present invention, the amorphous or poly-crystalline regions of stress relaxation 151 act to dissipate some of the stresses in the substrate 102. In fact, the presence of these regions enables division of the monocrystal substrate into zones 152 which behave like smaller independent crystals. The curvatures both physical and crystalline are accordingly considerably reduced.

In some embodiments, the stress in the substrate is reduced to the point where no cracking occurs, or only very minimal cracking in the substrate. Preferably, substantially all resulting cracking occurs in the regions of stress relaxation such that the region of monocrystal is substantially devoid of cracks. As described hereinabove, the prior art shows the use of amorphous or poly-crystalline zones in a layer of nitride of an element of group III to decrease the number of crystalline defects in the regions of monocrystal by trapping the dislocations in the amorphous or poly-crystalline zones of the layer of nitride of an element of group III. By contrast, the embodiments of the present invention utilise amorphous or poly-crystalline zones as regions of stress relaxation to reduce the physical and crystalline curvatures of the substrate or of the semiconductor wafer.

Figure 13:
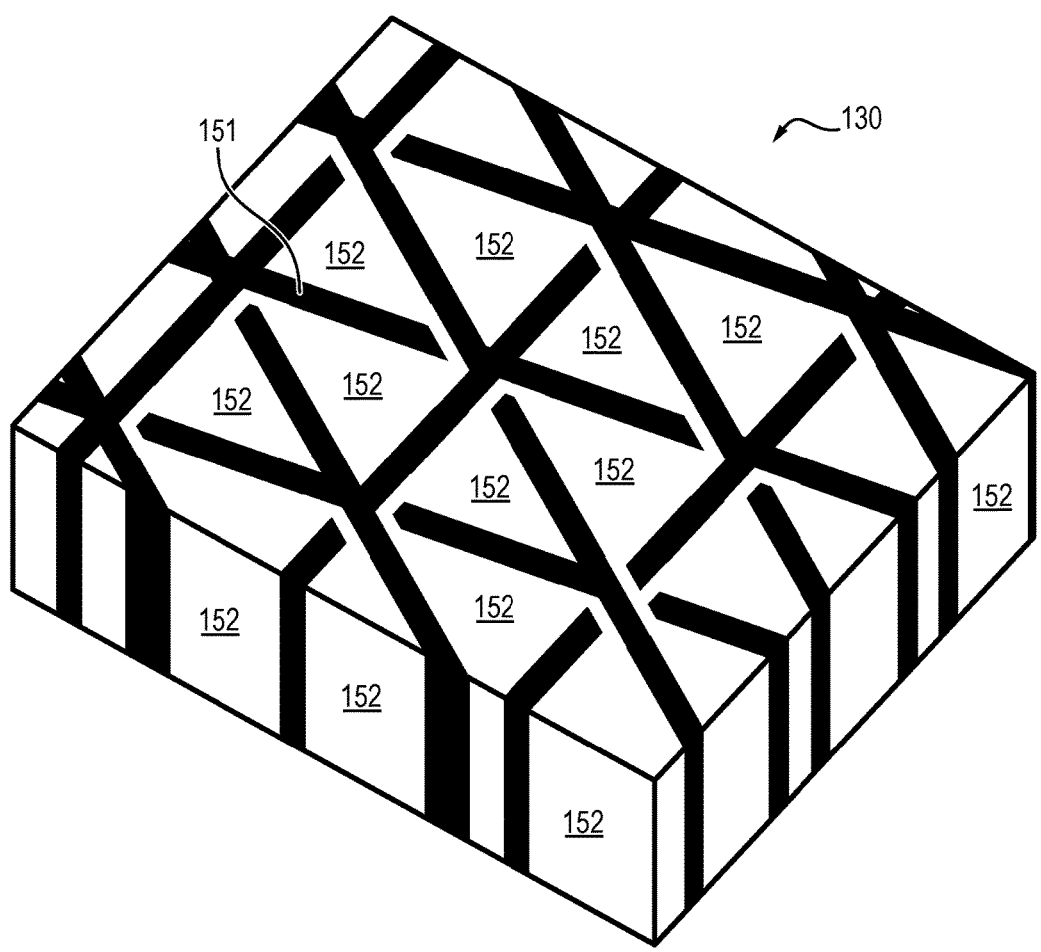

The expression «bidimensional forms» is used here to make reference to the forms on the surface of the substrate formed by the regions of stress relaxation. It must be understood that these «bidimensional forms» are simply the forms of the surface of a region of monocrystal which extends downwards through the substrate. Similarly, the regions of stress relaxation form forms or lines on the surface of the substrate as described here, but these regions extend also downwards through the substrate, extending preferably vertically from the upper surface of the substrate towards the lower surface of the substrate. FIG. 13 illustrates a pattern of regions of stress relaxation forming a plurality of interconnected bidimensional triangular forms on the surface of the substrate. As illustrated in FIG. 13, each of these regions or forms extends downwards through the substrate.

The semiconductor substrate comprises also at least one of the following:
- a physical curvature defining a radius of curvature of at least around 5 m;
- a variation in offcut angle (2β) less than or equal to around 0.6 degree between a bidimensional form in a central part of the substrate having an offcut angle (αc) and a bidimensional form in a peripheral part of the substrate arranged between the centre and a peripheral edge of the substrate having an offcut angle (αp); and
- a relaxation ratio (Asr/Asc) less than or equal to around 30%, where Asc is the area of the plurality of interconnected bidimensional forms and Asr is the area of the plurality of regions of stress relaxation.

In an embodiment, the substrate comprises a semiconductor wafer having a diameter of at least around 10 cm (around 4 inches) having a physical curvature defining a radius of curvature of at least around 12 m. Preferably, the embodiments of the present invention will have a physical curvature with a relative distance from a median reference plane less than or equal to ±50 less than or equal to ±40 μm, or less than or equal to ±25 μm, as illustrated in FIG. 12.

In some embodiments, the variation in offcut angle through the semiconductor wafer is controlled to be less than 0.2 degree (±0.1 degree) through the substrate independently of the size of the free-standing substrate. In some embodiments, the substrate comprises a semiconductor wafer having a diameter of around 5.1 cm (around 2 inches) and the semiconductor wafer comprises a crystalline curvature defining a radius of curvature of at least around 7 m. In some embodiments, the substrate comprises a semiconductor wafer having a diameter of around 10 cm (around 4 inches) and the semiconductor wafer comprises a crystalline curvature defining a radius of curvature of at least around 15 m.

In some embodiments, the substrate comprises a relaxation ratio (Asr/Asc) less than or equal to around 20%, 15%, 12%, or 10%, 5%, or 1%, where Asc is the area of the plurality of interconnected bidimensional forms and Asr is the area of the plurality of regions of stress relaxation.

According to one aspect, the geometric variation between the plurality of interconnected bidimensional forms is less than or equal to 20%, 15%, 10%, 9%, 8%, 7%, 6%, 5%, 4%, 3%, 2%, 1%, 0.75%, 0.5%, 0.25%, or 0.1% through the substrate. As used here, the expression «geometric variation» makes reference to any variation in the geometry of two of the bidimensional forms, including the size of the forms, the position of the forms on the substrate, the orientation of the forms on the substrate, at least one dimension of the forms, or a variation in total pitch between the regions of stress relaxation defining the plurality of forms. In some embodiments, the substrate comprises a variation in total pitch between the plurality of interconnected bidimensional forms through the substrate less than or equal to 20%, 15%, 10%, 9%, 8%, 7%, 6%, 5%, 4%, 3%, 2%, 1%, 0.75%, 0.5%, 0.25%, or 0.1% through the substrate. Preferably, the substrate comprises a variation in pitch less than or equal to 45 μm.

In some embodiments, a semiconductor substrate formed from material based on nitride of group III comprises a plurality of regions of stress relaxation; a region of monocrystal extending between the plurality of regions of stress relaxation, the region of monocrystal forming a plurality of interconnected bidimensional forms; where the geometric variation between the plurality of bidimensional forms is less than or equal to 10%, 9%, 8%, 7%, 6%, 5%, 4%, 3%, 2%, 1%, 0.75%, 0.5%, 0.25%, or 0.1% through the substrate.

According to another embodiment, a production batch of autosupported substrates can be formed by using the processes described here. In particular, a production batch can comprise at least 20 substrates formed consecutively relative to each other, which are not necessarily selected randomly in a larger reserve of substrates, which have been formed by using the same process and intended to have the same geometric and crystalline characteristics. For particular embodiments, a production batch of at least 20 substrates can be formed, in which each of the substrates has the characteristics described here.

Also, the production batch in its entirety can have particular characteristics. In some embodiments, a production batch of substrates comprises at least 20 substrates, each of the substrates in the batch comprising a semiconductor substrate formed from a material based on nitride of group III, the substrate comprising: a region of monocrystal; a plurality of regions of stress relaxation extending in at least one part of the substrate and defining a plurality of interconnected bidimensional forms in the region of monocrystal; and where the substrate comprises at least one of the following:
  a physical curvature defining a radius of curvature of at least around 5 m;
  a variation in offcut angle (2β) less than or equal to around 0.6 degree between a bidimensional form in a central part of the substrate having an offcut angle (αc) and a bidimensional form in a peripheral part of the substrate arranged between the centre and a peripheral edge of the substrate having an offcut angle (αp); and
  a relaxation ratio (Asr/Asc) less than or equal to around 30%, where Asc is the area of the plurality of interconnected bidimensional forms and Asr is the area of the plurality of regions of stress relaxation.

In such a production batch of substrates each of the substrates in the batch can also comprise a plurality of regions of stress relaxation; and a region of monocrystal extending between the plurality of regions of stress relaxation, the region of monocrystal forming a plurality of interconnected bidimensional forms, where the geometric variation between the plurality of bidimensional forms is less than or equal to 10%, 9%, 8%, 7%, 6%, 5%, 4%, 3%, 2%, 1%, 0.75%, 0.5%, 0.25%, or 0.1% through the substrate.

In some embodiments, a semiconductor substrate formed from a material based on nitride of group III comprises a region of monocrystal extending between a plurality of regions of stress relaxation, the region of monocrystal forming a plurality of interconnected bidimensional forms, where each form of the plurality has a region of high resistivity having resistivity of around 1.0 ohm-cm or more on the substrate surface in the form, and where each form of the plurality of forms is configured to contain at least one device structure formed on the substrate, said device structure having a device centre spaced apart from the region of high resistivity.

In some embodiments, a semiconductor substrate formed from a material based on nitride of group III comprises a region of monocrystal extending between a plurality of regions of stress relaxation, the region of monocrystal forming a plurality of interconnected bidimensional forms, where each form of the plurality of forms is configured to contain at least one device structure having a complementary form. A complementary form will be that in which the device structure is adjusted in the form of monocrystalline zone defined by the bidimensional form.

In some embodiments, a semiconductor substrate formed from a material based on nitride of group III comprises a plurality of regions of stress relaxation; a region of monocrystal extending between the plurality of regions of stress relaxation, the region of monocrystal forming a plurality of interconnected device regions having bidimensional forms; and a zone located towards the centre of at least one device region in which a dopant has been added to lower the resistivity of the monocrystalline material in the zone.

Preferably, the doped central zone has resistivity which is substantially identical to the resistivity of the non-doped material towards the periphery of each zone. The dopant can comprise germanium, for example. The resistivity of the doped central zone and the resistivity of the non-doped material towards the periphery of each zone are between around 0.01 ohm-cm and 1.0 ohm-cm, and preferably less than or equal to around 0.1 ohm-cm.

According to an aspect, the interconnected bidimensional forms are formed by a repetitive pattern of isolated regions of stress relaxation. The regions of stress relaxation are each preferably in the form of at least two connected lines extending in at least two non-parallel directions. The term «lines» makes reference to the bidimensional form of surface of the regions of stress relaxation, even though the regions extend through the substrate. In reference to FIG. 4, for example, the bidimensional form of surface of the regions of stress relaxation (amorphous or poly-crystalline zones 51) is generally in the form of two lines crossing each other (not parallel). In an embodiment, one of the lines could have for example a width of around 10 μm and a length of 400 μm, whereas the second line, which crosses the central part of the first line according to an angle, could have for example a width of around 10 μm and a length of around 200 μm.

The pattern of the regions of stress relaxation can form a plurality of interconnected polygonal, circular, ellipsoidal, irregular, hexagonal, equilaterally triangular or triangular forms. In an embodiment, the pattern of the regions of stress relaxation forms a plurality of interconnected forms in which the largest dimension of the bidimensional form is at least 100 μm, at least 200 μm, or at least 300 μm. In another embodiment, the pattern of the regions of stress relaxation forms a plurality of interconnected forms in which the smallest dimension of the bidimensional form is at least 200 μm or more. In some embodiments, the pattern of the regions of stress relaxation forms a plurality of interconnected forms in which the dimension of the bidimensional form in a first direction is greater than the dimension of the bidimensional form in a second direction.

Any one of the preceding claims, in which the pattern of the regions of stress relaxation forms a plurality of interconnected forms having an area of at least 14 $cm^2$.

The regions of stress relaxation forming the repetitive pattern can have a width of at least 10 μm, for example a width of around 10 μm to 100 μm. The regions of stress relaxation can each be for example in the form of at least two connected lines extending in at least two non-parallel directions. The regions of stress relaxation can be each in the form of at least two connected lines, one of the lines forming an angle with the other line. The regions of stress relaxation can each be in a form in which a part of the form extends in a direction on the substrate surface, whereas another part of the form extends in a different direction on the substrate surface.

As described hereinabove, the plurality of regions of stress relaxation acts to dissipate stress through the substrate. In some embodiments, the semiconductor substrate comprises gallium nitride. In some embodiments, the semiconductor substrate has a thickness greater than 1 µm, preferably from 100 µm to 10 cm, more preferably from 500 µm to 3 mm.

In some embodiments, the plurality of interconnected bidimensional forms comprises at least one first form at a central region of the substrate and a second form at a peripheral region of the substrate, and the geometric variation between the first form and the second form is less than or equal to 10%, 9%, 8%, 7%, 6%, 5%, 4%, 3%, 2%, 1%, 0.5%, 0.25%, or 0.1%. The plurality of interconnected bidimensional forms comprises at least one first form at a central region of the substrate and a second form at a peripheral region of the substrate, and the geometric variation between the first form and the second form is between 0.1% and 5%, or between 0.01% and 10%. The geometric variation can comprise at least one of the following: the size of the form, the position of the form on the substrate, the orientation of the form on the substrate, at least one dimension of the form, or a variation in total pitch between the regions of stress relaxation defining the plurality of forms.

In some embodiments, the interconnected bidimensional forms are connected by at least one zone of monocrystalline material having a width of at least 10 µm, for example a width of around 10 µm to 100 µm.

In some embodiments, the semiconductor substrate comprises a variation in offcut angle ($2\beta$) less than or equal to around 0.4 degree (+0.2 degree), 0.38 degree, 0.36 degree, 0.34 degree, 0.32 degree, 0.3 degree, 0.28 degree, 0.26 degree, 0.24 degree, 0.22 degree, or 0.20 degree between a bidimensional form in a central part of the substrate having an offcut angle ($\alpha c$) and a bidimensional form in a peripheral part of the substrate arranged between the centre and a peripheral edge of the substrate having an offcut angle ($\alpha p$).

In some embodiments, the region of monocrystal comprises a density of dislocations less than or equal to around $1 \times 10^7$ dislocations/cm2, $9 \times 10^6$ dislocations/cm2, $8 \times 10^6$ dislocations/cm2, $7 \times 10^6$ dislocations/cm2, $6 \times 10^6$ dislocations/cm2, $5 \times 10^6$ dislocations/cm2, $4 \times 10^6$ dislocations/cm2, $3 \times 10^6$ dislocations/cm2, $2 \times 10^6$ dislocations/cm2, $1 \times 10^6$ dislocations/cm2, $1 \times 10^5$ dislocations/cm2, or $1 \times 10^4$ dislocations/cm2.

The embodiments here represent an innovation relative to the prior art. The present application presents a particular process for forming semiconductor substrates using a particular combination of characteristics, comprising the processes described hereinabove which form amorphous and/or poly-crystalline zones or regions in a layer of nitride of element of group III. As described hereinabove, the prior art shows the use of these amorphous or poly-crystalline zones in a layer of nitride of an element of group III to lower the number of crystalline defects in regions of monocrystal by trapping the dislocations in the amorphous or poly-crystalline zones of the layer of nitride of an element of group III. But in these documents, it is neither described nor suggested that the presence of amorphous or poly-crystalline zones in a layer of nitride of an element of group III absorbs the stresses of the layer of nitride of an element of group III.

On the contrary, the embodiments of the present invention use amorphous or poly-crystalline zones as regions of stress relaxation to reduce the physical and crystalline curvatures of the substrate or the semiconductor wafer. Introducing amorphous and/or poly-crystalline regions provides zones in which stress can be relaxed without creating cracks. This enables manufacture of a layer of very high quality of monocrystalline gallium nitride without cracks in the substrate.

The expert will have understood that numerous modifications can be made to the processes and materials described hereinabove without departing materially from the new ideas presented here.

It is therefore evident that the examples which have just been given are only particular non-limiting illustrations.

The invention claimed is:

1. A semiconductor substrate, comprising a material including a Group III element nitride, the material comprising:
    a plurality of regions of stress relaxation, and
    a monocrystalline region, extending in at least a portion of the substrate and including a plurality of interconnected bidimensional forms,
    wherein each bidimensional form has a Dmax/Dmin ratio of a largest dimension (Dmax) to a smallest dimension (Dmin) of the bidimensional form between 5 and 20.

2. The substrate as claimed in claim 1, wherein the substrate comprises at least one of the following:
    a physical curvature defining a radius of curvature of at least around 5 m;
    a variation in offcut angle less than or equal to around 0.6 degrees between a bidimensional form in a central part of the substrate having an offcut angle and a bidimensional form in a peripheral part between the centre and a peripheral edge of the substrate having an offcut angle; and
    a relaxation ratio (Asr/Asc) less than or equal to around 30%, where Asc is an area of the plurality of interconnected bidimensional forms and Asr is an area of the plurality of regions of stress relaxation.

3. The substrate as claimed in claim 1, wherein a geometric variation between the plurality of bidimensional forms is less than or equal to 10% through the substrate, and wherein the geometric variation comprises at least one of the following:
    variation of a size of the plurality of bidimensional forms,
    variation of the position of the form on the substrate,
    variation of an orientation of the plurality of bidimensional forms on the substrate,
    variation of at least one dimension of the plurality of bidimensional forms, or
    variation in total pitch between the regions of stress relaxation defining the plurality of forms.

4. The substrate as claimed in claim 1, wherein each form of the plurality of bidimensional forms has a region having resistivity of around 1.0 ohm-cm or more on a surface of the substrate, and wherein each form of the plurality of bidimensional forms is configured to contain at least one device structure formed on the substrate, said device structure having a device centre spaced apart from the region of each form.

5. The substrate as claimed in claim 1, wherein the monocrystalline region forms a plurality of interconnected device regions having bidimensional forms, and wherein the substrate comprises a central zone located towards a centre of at least one device region and including a dopant.

6. The semiconductor substrate as claimed in claim 5, wherein the central zone has resistivity that is substantially identical to resistivity of a non-doped material towards the periphery of the region.

7. The semiconductor substrate as claimed in claim 5, wherein the dopant comprises germanium.

8. The semiconductor substrate as claimed in claim 5, wherein the resistivity of the central zone and resistivity of a material towards a periphery of the region are between around 0.01 ohm-cm and 1.0 ohm-cm.

9. The semiconductor substrate as claimed in claim 1, wherein directions defined by the largest dimensions of the bidimensional forms are distributed uniformly between two perpendicular orientations defined on a surface of the substrate.

10. The semiconductor substrate as claimed in claim 1, wherein directions defined by the largest dimensions of the bidimensional forms are distributed uniformly between three separate orientations of 120° defined on a surface of the substrate.

11. The semiconductor substrate as claimed in claim 1, wherein the directions defined by the largest dimensions of the bidimensional forms are distributed uniformly between orientations defined on a surface of the substrate by directions of the crystalline axes of a family of direction [10-10] or of a family of direction [11-20].

12. The semiconductor substrate as claimed in claim 1, wherein the regions of stress relaxation comprise at least one of a poly-crystalline material and amorphous material.

13. The semiconductor substrate as claimed in claim 1, wherein the plurality of interconnected bidimensional forms is defined by a repetitive pattern of isolated regions of stress relaxation.

14. The semiconductor substrate as claimed in claim 13, wherein each region of stress relaxation has a pattern including at least two connected lines extending in at least two non-parallel directions when viewed from a surface of the semiconductor substrate.

15. The semiconductor substrate as claimed in claim 13, wherein the repetitive pattern of the isolated regions of stress relaxation forms the plurality of interconnected forms having an area of at least 14 cm$^2$.

16. The semiconductor substrate as claimed in claim 13, wherein the regions of stress relaxation have a width of at least 10 μm.

17. The semiconductor substrate as claimed in claim 1, wherein the semiconductor substrate comprises gallium nitride.

18. The semiconductor substrate as claimed in claim 1, wherein the semiconductor substrate has a thickness greater than 1 μm and at most 10 cm.

19. The semiconductor substrate as claimed in claim 3, wherein the plurality of interconnected bidimensional forms comprises a first form at a central region of the semiconductor substrate and a second form at a peripheral region of the semiconductor substrate, wherein the geometric variation between the first form and the second form is between 0.1% and 5%.

20. The semiconductor substrate as claimed in claim 1, wherein the plurality of interconnected bidimensional forms are connected by at least one zone of monocrystalline material having a width of at least 10 μm.

21. The semiconductor substrate as claimed in claim 1, wherein the semiconductor substrate comprises a variation in offcut angle less than or equal to around 0.4 degree±0.2 degrees between:
 a bidimensional form in a central part of the substrate having an offcut angle and
 a bidimensional form in a peripheral part of the substrate arranged between the centre part and a peripheral edge of the semiconductor substrate having an offcut angle.

22. The semiconductor substrate as claimed in claim 1, wherein the regions of stress relaxation extend vertically from an upper surface of the semiconductor substrate towards a lower surface of the semiconductor substrate.

23. The semiconductor substrate as claimed in claim 1, wherein the monocrystalline region comprises a density of dislocations less than or equal to around $1 \times 10^7$ dislocations/cm$^2$, and wherein the regions of stress relaxation comprise a density of dislocations greater than around $1 \times 10^8$ dislocations/cm$^2$ or $1 \times 10^9$ dislocations/cm$^2$.

24. The semiconductor substrate as claimed in claim 1, wherein the semiconductor substrate comprises a physical curvature with a relative distance from a median reference plane representing the surface plane of a semiconductor wafer without curvature, less than or equal to ±50 μm.

25. The semiconductor substrate as claimed in claim 1, wherein the semiconductor substrate comprises a semiconductor wafer having a diameter equal to around 10 centimetres, and wherein the semiconductor wafer comprises a crystalline curvature defining a radius of curvature of at least around 15 m.

26. The semiconductor substrate as claimed in claim 1, wherein the semiconductor substrate comprises a variation in pitch, between the regions of stress relaxation defining the plurality of forms, less than or equal to 45 μm.

27. A method of manufacturing an optoelectronic component comprising: producing the optoelectronic component on the semiconductor substrate as claimed in claim 1.

* * * * *

UNITED STATES PATENT AND TRADEMARK OFFICE
CERTIFICATE OF CORRECTION

PATENT NO. : 10,497,833 B2  
APPLICATION NO. : 15/865065  
DATED : December 3, 2019  
INVENTOR(S) : Jean-Pierre Faurie et al.

Page 1 of 1

It is certified that error appears in the above-identified patent and that said Letters Patent is hereby corrected as shown below:

In the Claims

Column 26, Line 19, Claim 1: Please delete "Dmax/Drain" and insert --Dmax/Dmin--.

Signed and Sealed this
Seventh Day of December, 2021

Drew Hirshfeld
*Performing the Functions and Duties of the
Under Secretary of Commerce for Intellectual Property and
Director of the United States Patent and Trademark Office*